United States Patent [19]

Higuchi et al.

[11] Patent Number: 4,937,480

[45] Date of Patent: Jun. 26, 1990

[54] BICMOS BUFFER CIRCUIT

[75] Inventors: Hisayuki Higuchi, Kokubunji; Makoto Suzuki, Niiza; Noriyuki Homma, Kodaira, all of Japan

[73] Assignee: Hitachi, Ltd., Tokyo, Japan

[21] Appl. No.: 373,263

[22] Filed: Jun. 27, 1989

Related U.S. Application Data

[63] Continuation of Ser. No. 131,644, Dec. 11, 1987, Pat. No. 4,858,191.

[30] Foreign Application Priority Data

Dec. 12, 1986 [JP] Japan .................................. 61-297030
Apr. 30, 1987 [JP] Japan .................................. 62-104688
Sep. 11, 1987 [JP] Japan .................................. 62-226338

[51] Int. Cl.$^5$ ............... H03K 19/01; H03K 19/003; H03K 19/082; H03K 19/094
[52] U.S. Cl. .................................. 307/570; 307/446; 307/443; 307/279
[58] Field of Search ............... 307/443, 455, 272.1, 307/445, 446, 289–292, 592, 570, 296.6, 473, 475, 355, 356, 358, 360, 264, 278, 308, 279

[56] References Cited

U.S. PATENT DOCUMENTS

| | | | |
|---|---|---|---|
| 4,695,750 | 9/1987 | Hara et al. | 307/446 X |
| 4,740,718 | 4/1988 | Matsui | 307/446 |
| 4,779,014 | 10/1988 | Masuoka et al. | 307/570 X |
| 4,858,191 | 8/1989 | Higuchi et al. | 365/189.05 |

Primary Examiner—Stanley D. Miller
Assistant Examiner—David R. Bertelson
Attorney, Agent, or Firm—Antonelli, Terry, Stout & Kraus

[57] ABSTRACT

A semiconductor integrated circuit includes an input buffer circuit, a decoder circuit and a plurality of memory cells. Each of the input buffer circuit and the decoder circuit consists of a combination of bipolar transistors and MOS transistors. In this combination various measures are taken to increase the operation speed and to reduce the electric power consumption. In an example thereof the data line load for the memory cells is constituted by Schottky barrier type diodes. In another example the load used for the respective emitter follower transistors is constituted by an MOS transistor operating as a variable resistance. In still another example, in a CMOS NOR ciruit of the decoder circuit the number of P channel MOS transistors are fewer than the number of N channel MOS transistors.

4 Claims, 22 Drawing Sheets

|  |  | INPUT BUFFER | DECODER | MEMORY CELL | SENSE AMP. | OUTPUT BUFFER |
|---|---|---|---|---|---|---|
| BEFORE THE INVENTION | ACCESS TIME | ~9ns |  | 4ns |  | 2.5ns |
| BEFORE THE INVENTION | OCCUPATION AREA | ~4% | ~30% | 55% | 4% | 1% |
| THE INVENTION | ACCESS TIME | ~7ns |  | — | 3ns | 2.5ns |

BICMOS BUFFER CIRCUIT

This is a continuation of Ser. No. 131,644, filed 12/11/87, now U.S. Pat. No. 4,858,191.

BACKGROUND OF THE INVENTION

This invention relates to a semiconductor integrated circuit such as a semiconductor memory device, etc. and in particular to a semiconductor integrated circuit, with an improved circuit operation speed, an improved stabilization of the operation and with improved reliability such as the immunity or strength against latch-up, etc.

Memory devices, which combine MOS transistors, whose electric power consumption is small, with bipolar transistors capable of high speed operation in order to make the most of the advantages of both kinds of transistors, have been developed.

FIG. 3 is a block diagram illustrating the construction of a memory combining MOS transistors with bipolar transistors, which was studied by the inventors of this invention before the application thereof. Such a memory is provided with a function to read out information stored in memory cells, as well as to write information in memory cells in accordance with input signals. That is, as indicated in FIG. 3, the input signal received is amplified by an input buffer and decoded by a decoder. Then the signal selects a word line and a driving circuit not shown in the figure drives a Y-switch so as to select one of data lines. In this way information read out from a memory cell is amplified by a sense amplifier through a data line and a pair of common data line and outputted to a data output terminal through an output buffer. The access time representing this memory speed is, as indicated in FIG. 4, 3 ns for the input buffer, 4 ns for the decoder, 4 ns for the sense amplifier, and 2.5 ns for the output buffer. That is, in the access time of 13 ns, the delay times necessary for these circuits are nearly equal to each other and therefore, in order to increase the speed, it is necessary to shorten the delay time for each of these circuits. Further, the point to which attention should be paid, when the circuit stabilization of the operation is improved, consists the desirablility to suppress to the utmost the increase in the chip size of the memory LSI. Since the ratio of the area occupied by each of these circuits in the memory area is determined, as indicated in FIG. 4, the measure of the chip size of the memory LSI is determined on the basis thereof. As clearly seen from this figure, if attention is paid to the increase in the size of memory cells, the increase in the occupation area of the other circuits does almost not contribute to the chip size.

On the other hand, recent electronics have been directed towards a higher speed and with more functions, not excepting the memory LSI and it is desired to increase further the speed and the degree of integration and to lower electric power consumption.

In a prior art semiconductor memory device, it was limited to increasing the speed, because it had the following properties, and the access time was almost as indicated in FIG. 4 for a memory designed with the minimum working size of 2 $\mu$m.

(a) an MDS type current mirror circuit is used in the input buffer circuit;

(b) a successive decoding circuit is used in the decoder circuit;

(c) MOS transistors are used for data line load elements; and (d) the electrostatic capacitance of the common data line sending signals to the sense amplifier is high.

Because of these factors that are characteristic of the prior art circuit, it was difficult to increase further the memory operation speed.

Further, as another prior art semiconductor device, there is known a device disclosed e.g. in Japanese Patent Unexamined Publication No. 60-217725, in which a resistor or a constant current source is used as a bias current source for an emitter follower circuit.

Still further, heretofore, in order to lower electric power consumption, which increases with an increasing degree of integration of the LSI, it has also been tried to form the LSI by using CMOSs. However, in the case where low electric power consumption and a high speed operation are required, recently BiCMOS·LSIs, in which bipolar transistors and MOS transistors are integrated in the same chip, are studied. In these LSIs the amplitude of signals in their inner circuits is about 5 V. Contrarily thereto, the amplitude of the input signal to the LSIs is about 0.8 V for ECLs seeking for high speed characteristics and 1.4 V at the lowest for TTLs used usually in CMOS·LSIs, these values being small with respect to 5 V stated above, and therefore it is necessary to convert the signal level at the input part of the LSIs. Further, in a memory LSI it is necessary to amplify the amplitude of the signal read out from a memory cell, to a desired level. As a circuit for converting signals at the ECL level ($-0.9$ V$--1.7$ V) into those at the level (0 V$--5$ V) used in CMOS circuits etc., there is known a circuit combining a CMOS differential amplifier circuit, a level shift circuit and a current mirror type buffer circuit, discussed e.g. in ISSC Digest of Technical Papers, 1982, pp. 248-249. Although this circuit is constructed only by MOS transistors and therefore its construction is simple, as a result of a large number of circuit stages used, the time necessary for the conversion is longer than 4 ns and it is not possible to achieve high speed characteristics. Furthermore electric current consumed by fifteen of these circuits is 65% of the total consumed current of 150 mA of an LSI.

SUMMARY OF THE INVENTION

The object of this invention is to provide a semiconductor integrated circuit without the problems described above wherein it is capable of a high speed operation, operating stably and capable of reducing the chip size.

Other objects and features of this invention will become obvious from the embodiments described later.

DESCRIPTION OF THE PREFERRED EMBODIMENTS

Figure 1:
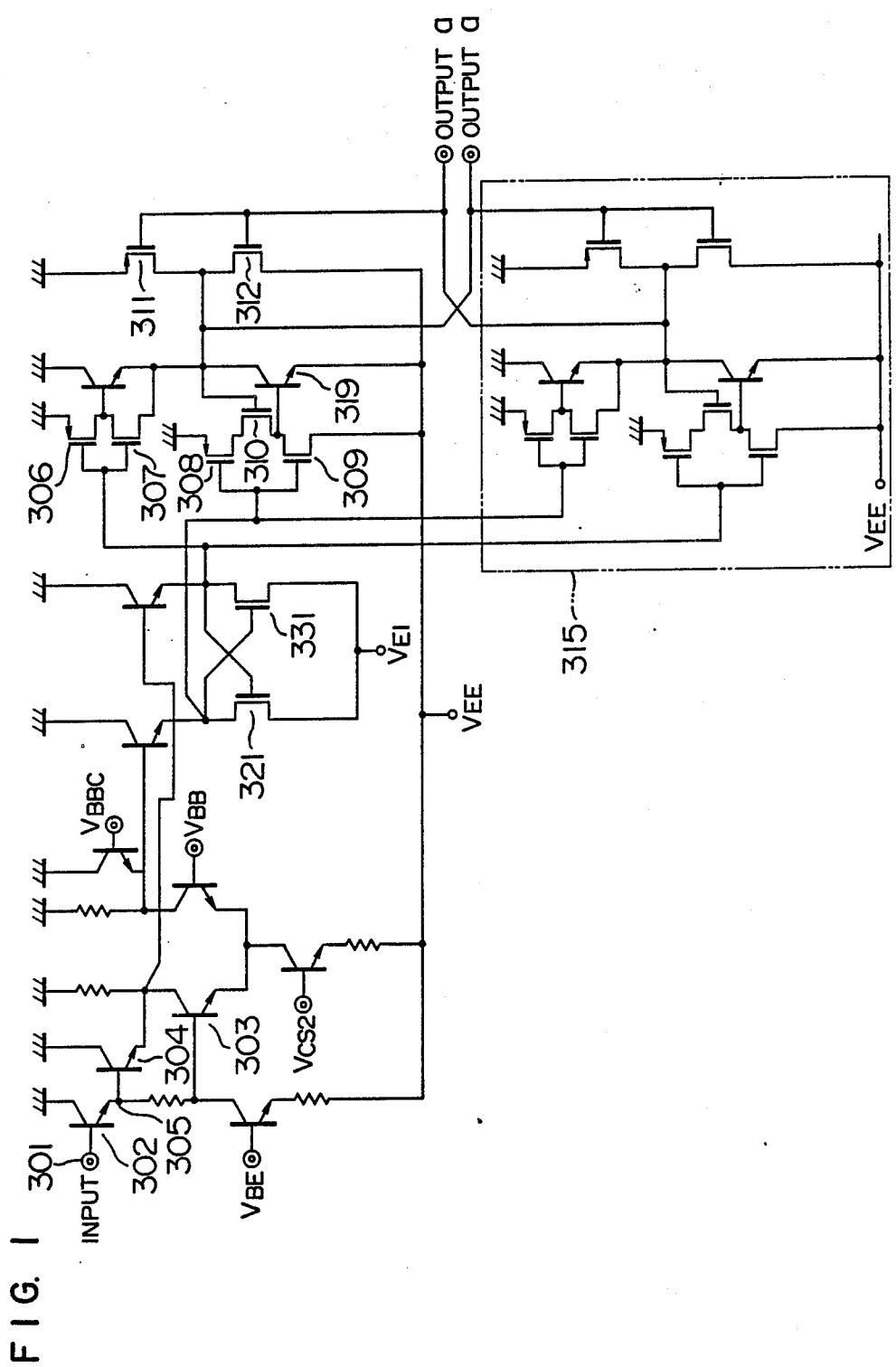
FIG. 1 is a circuit diagram of a high speed buffer circuit for a memory LSI, which is an embodiment of this invention.

Hereinbelow embodiments of this invention will be explained more in detail, referring to the drawing.

FIG. 1 is a circuit diagram of a high speed buffer circuit for a semiconductor memory device showing an embodiment of this invention.

Figures 3, 4:
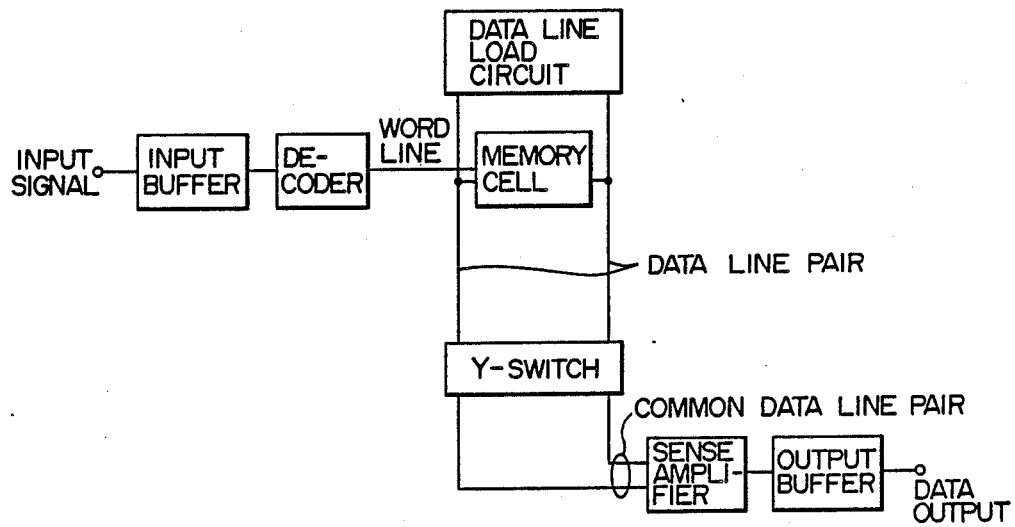
FIG. 3 is a block diagram illustrating the basic construction of the memory LSI.
FIG. 4 is a scheme comparing characteristics, the delay time and the occupation area of each of the element circuits of a memory LSI before this invention with those of the memory LSI according to this invention.

A signal of ECL level inputted in an input terminal 301 is level-shifted by a bipolar transistor 302 and led to the base of a bipolar transistor 303 in a current mode circuit. The input signal is amplified to about 2 V by this current switching circuit. At this time, if the amplified voltage is too high or if the voltage at the input terminal is raised over $-0.5$ V, the bipolar transistor 303 in the current switching circuit is saturated and sometimes it can happen that a latch-up phenomenon is produced, which may make the memory operation impossible. In order to prevent this, a bipolar transistor 304 is connected thereto. By adding this bipolar transistor 304 thereto, even when the voltage of the input signal exceeds the standard value therefor or the amplitude of the output of the current mode circuit becomes too great, the saturation of the transistor 303 is prevented so that the stable circuit operation can be obtained. An affirmation and a negation signal amplified by the current mode circuit are led to an emitter follower circuit, whose load is constituted by MOS transistors 321 and 331. The sources of the load MOS transistors 321 and 331 are connected with the power source $V_{E1}$. This emitter follower circuit is disposed for the purpose of reducing the load of the current mode circuit and driving following steps of the circuit with a high driving power. Here the reason why MOS Transistors are used for the load is based on the fact that it is possible to obtain a high speed operation with a low electric power consumption with respect to the case where pure resistances are used as the load, because the output amplitude of the emitter-follower circuit is as high as about 2 V. It is also possible to dispose an emitter follower load resistor and an MOS FET 321 in parallel. The negation signal output of the emitter follower circuit is led to the gates of MOS Transistors 306 and 307 and the affirmation signal output is led to the gates of MOS transistors 308 and 309. The signal amplitude is amplified to the power source voltage by this voltage boosting circuit. At this time an MOS transistor 310 is conductive, only when the output voltage is close to the ground potential. When it approaches to the potential $V_{EE}$ of the power source, the MOS transistor 310 is no more conductive, the bipolar transistor 319 loses its driving power. That is, it can be seen that this circuit exhibits its driving power, only when its output is switched over from the high level to the low level, and otherwise it has no driving power. It is a matter of course that no electric power is consumed, except when the signal is switched over and therefore the circuit can work with a low electric power consumption. MOS transistors 311 and 312, which are connected after this circuit, make this circuit have the driving power except for the time when the signal is switched over and stabilize the output voltage. In the gate terminals of the MOS transistors 311 and 312 a signal coming from a circuit 315 is inputted, in which circuit the affirmation and the negation are interchanged in the circuit described above. For this reason, since the signal arriving at the gates of these MOS transistors reaches them after the switching over of this circuit, when the driving power of the MOS transistors is too great, the delay time may be increased. Usually it is desirable that the ratio of the driving powers of the two circuits is greater than 10:1. When this circuit is designed with the standard values identical to those indicated in FIG. 4, the delay time of the input buffer is shortened to 2 ns, which is shorter than that obtained by the prior art technique by about 1 ns.

Figure 2:
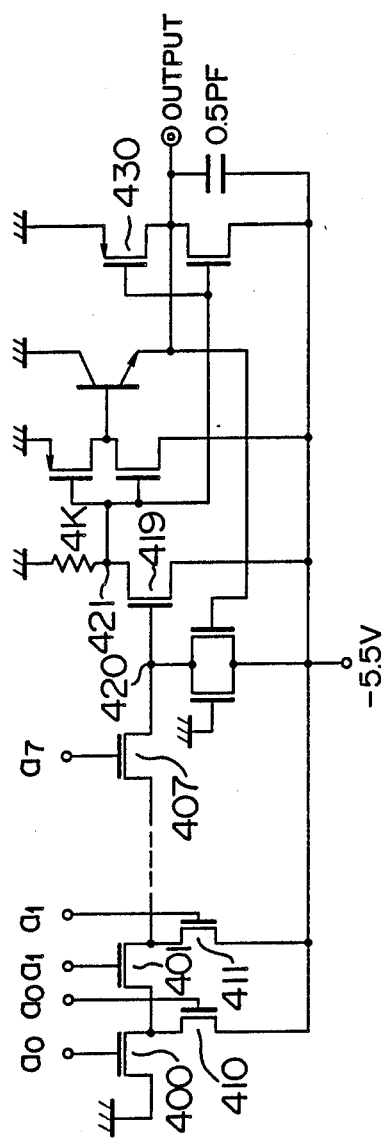
FIG. 2 is a circuit diagram of a high speed decoder circuit for the memory LSI, which is an embodiment of this invention.

FIG. 2 is a circuit diagram of a high speed decoder circuit for the semiconductor memory device, which is an embodiment of this invention. Input signals amplified to the source voltage by the input buffer circuit indicated in FIG. 1 are supplied to input terminals from $a_0$ to $a_7$ of the decoder circuit. At this time, if there is at least one low level signal among the input signals, this decoder circuit outputs a low level signal. That is, since the MOS transistors, whose gates are these input terminals, are connected in series, if there is even one low level input, they are non-conductive, their output is at the low level. This circuit outputs only one high level signal, depending on the input signal level. Here, although the negation signals $\overline{a_0}$, $\overline{a_1}$, etc. of the address signals gates of the MOS transistors 410 and 411, if input buffer circuits described in the preceding embodiment are used, since they have an advantage that the affirmation and the negation signals are formed with the same delay time, it never happens that the timings of the two signals are deviated and thus e.g. the MOS transistors 400 and 410 become conductive simultaneously, which gives rise to passing-through current. The signal decoded by this circuit is led to the gate of an MOS transistor 419. When this signal is at the high level, this MOS transistor 419 is conductive, the potential at a node 421 is lowered. This signal is further led to a boosting circuit consisting of a combination of a bipolar transistor and MOS transistors and having a high driving power and amplified to the source voltage. Although an MOS transistor is used here for the transistor 419, a bipolar transistor may be used therefor. At this time, in order to prevent the saturation of the bipolar transistor and to increase the speed thereof, it is desired to clamp the signal by means of a Schottky barrier type diode or an MOS FET.

Figure 5:
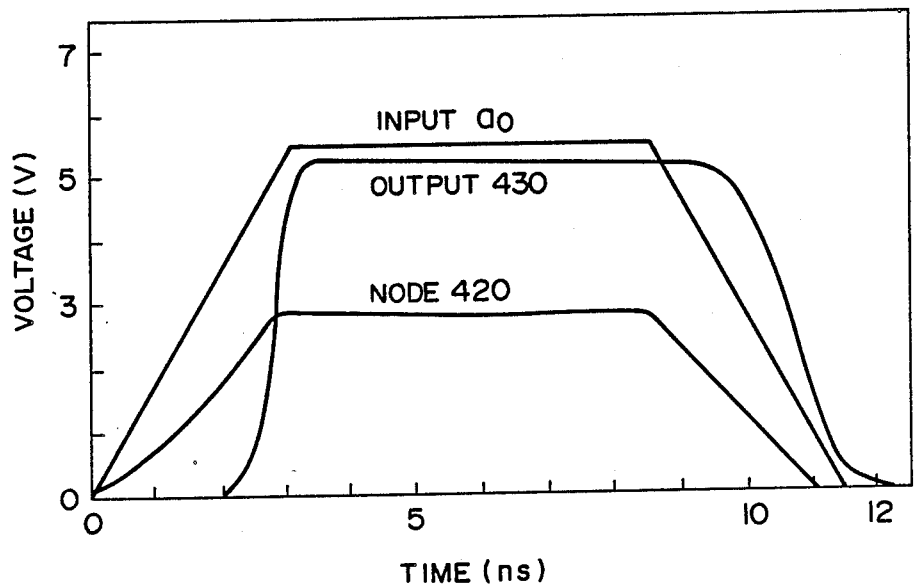
FIG. 5 is a graph indicating variations in the voltage at different nodes in FIG. 1 with respect to time.

FIG. 5 shows characteristic curves indicating variations in the voltage at the input, the node 420 and the output 430 of the decoder circuit indicated in FIG. 2 with respect to time. The decoding is effected in total in 1.5 ns, i.e. about 0.5 ns from the signal input to the node, where the decoded signal is formed, and about 1 ns for the boosting to the source voltage.

Although N channel MOS transistors are mentioned in the embodiment, of course P channel MOS transistors may be used. Further it is also possible to use N channel and P channel MOS transistors in a complementary form and to effect the decoding with signals of only one side there of without using affirmation and negation signals.

Figure 6:
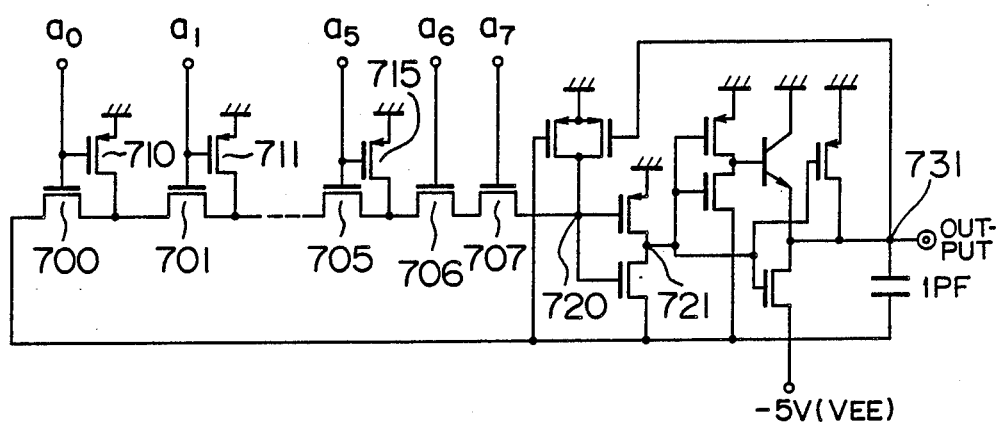
FIG. 6 is a circuit diagram of a high speed decoder circuit, which is another embodiment of this invention.

FIG. 6 is a circuit diagram illustrating the construction of another decoder circuit, which is a variation of the circuit indicated in FIG. 2. Contrary to the decoder circuit indicated in FIG. 2, where the output is at the high level, only when all the address signals are at the high level, the circuit can be so constructed that the output is at the low level, only when all the address signals are at the high level, as indicated in FIG. 6. Since the operation of this circuit is almost identical to that of the circuit indicated in FIG. 2, explanation there of will be omitted.

Figure 7:
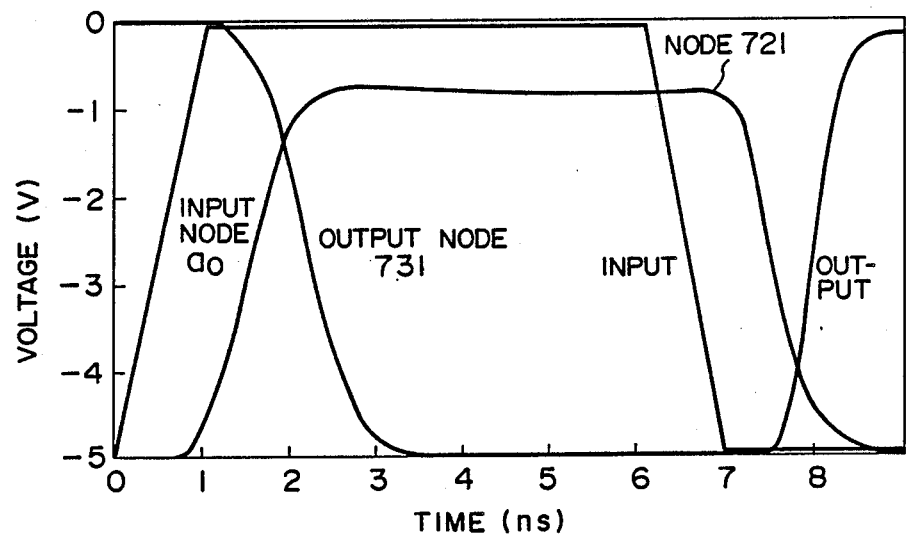
FIG. 7 is a graph indicating variations in the voltage at different nodes in FIG. 6 with respect to time.

FIG. 7 shows characteristic curves indicating variations in the voltage at different nodes of the decoder circuit indicated in FIG. 6 with respect to time. The delay time of this decoder circuit is nearly equal to that of the circuit indicated in FIG. 2. That is, when a signal is inputted in the input node $a_0$ at a point of time of 0 ns, it takes about 0.5 ns to be decoded at a node 721 and about 1 ns to be boosted to the source voltage. Therefore the necessary total time is 1.5 ns. At the output node 731 an output of inverse polarity is supplied.

Figure 8:
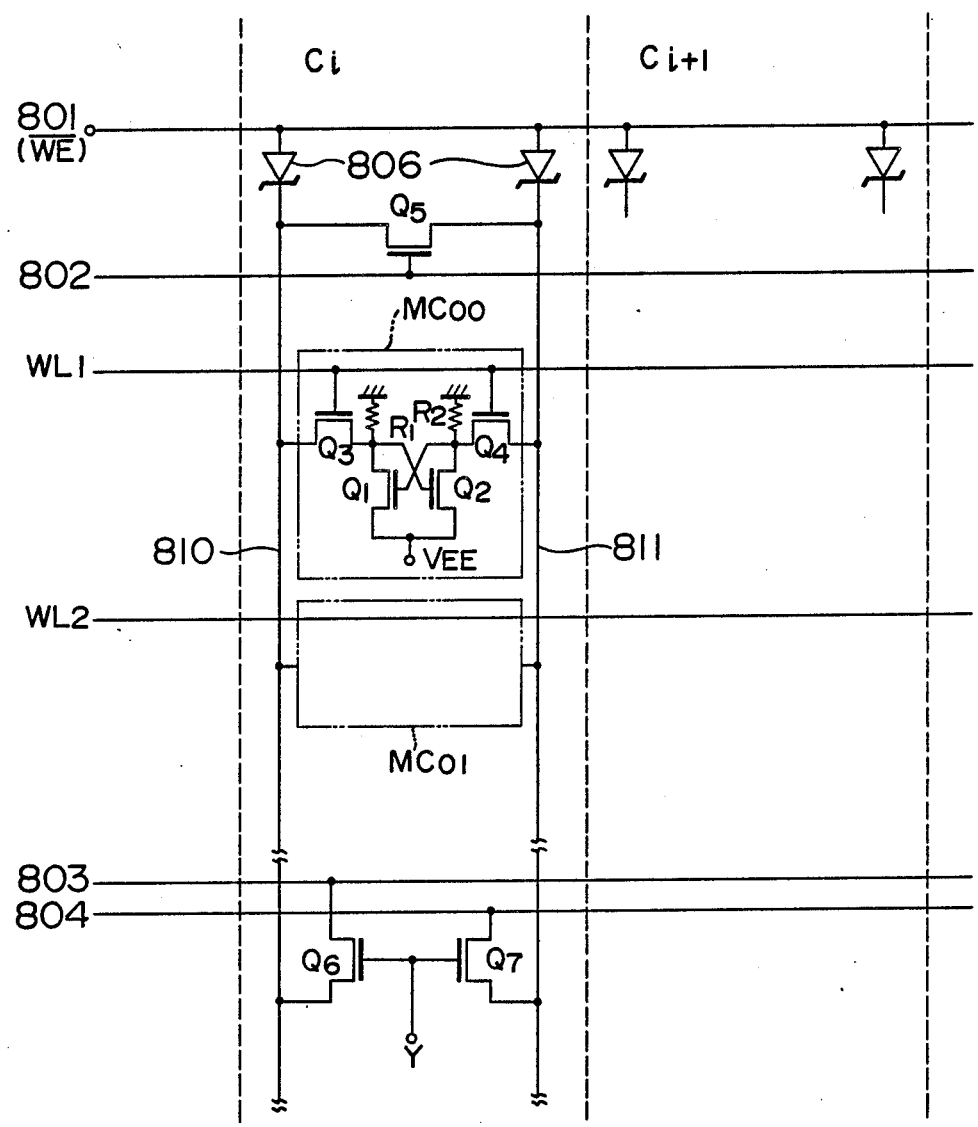
FIG. 8 is a circuit diagram illustrating the construction of load elements of the data line showing an embodiment of this invention.

FIG. 8 is a circuit diagram illustrating the construction of a memory cell, which is an embodiment of this invention, in which Schottky barrier type diodes 806 are used as load elements in data lines 810, 811. In FIG. 8, the line 801 is driven by a signal $\overline{WE}$, which is inverse with respect to a write enable signal WE, and it is held at the ground level in the stationary state and at $V_{EE}$, which is $-5$ V, in the write-in state. Memory cells $MC_{00}$, $MC_{01}$ are static random access memories (SRAM), each of which consists of a pair of driving MOS FET $Q_1$ and $Q_4$, whose sources are connected to the negative source voltage $V_{EE}$, their gates and drains being cross coupled, high resistance load resistors $R_1$ and $R_2$, and transfer gate MOS FETs $Q_3$ and $Q_4$ controlled by word lines $WL_1$ and $WL_2$. In the case where the memory cells $MC_{00}$ and $MC_{01}$ are not selected, an MOS FET $Q_5$ for equalizing, driven by a line 802 is turned to the on-state and as the result the potentials of the data lines 810 and 811 are approximately equalized to each other. Further the word lines $WL_1$ and $WL_2$ are driven by the decode output of the decoder circuit indicated in FIG. 2 or 6. MOS FETs $Q_6$ and $Q_7$ controlled by a Y-switch control signal constitute the Y-switches, which make the signal transmission between the data lines 810 and 811 and the data write lines 803 and 804, respectively, possible. By the read out of the data from the memory-cell $MC_{00}$, depending on the stored data represented by whether the drains of the driving MOS FETs $Q_1$ and $Q_2$ are at the high level or the low level, a difference is produced in the currents flowing through the Schottky barrier type diodes 806, the transfer gate MOS FETs $Q_3$ and $Q_4$, which gives rise to a potential difference in the pair of the Schottky barrier type diodes 806, depending on this difference in the current. This potential difference is amplified by the switching means connected with the data lines 810 and 811, the sense amplifier and the output buffer.

By the write-in of the data to the memory cell $MC_{00}$ the data are transmitted from a data writing circuit (not shown in the figure) connected with the data write lines 803 and 804 to the memory cell $MC_{00}$ through the Y-switches $Q_6$, $Q_7$ and the data lines 810, 811. At this time, since the line 801 is biased to the negative source voltage $V_{EE}$, the impedance of the pair of the Schottky barrier diodes 806 is great, which prevents for the written data to leak to the line 801 through the data line load elements.

Before the application of this invention MOS transistors were used as these data line load resistors and recently a trial to use bipolar transistors instead thereof is also reported. In the former case, where MOS transistors are used, if the resistance is reduced in order to increase the speed, it is necessary to increase the gate width of the MOS transistors. For example, for obtaining an effective resistance 500Ω the gate width should be designed to be greater than 40 μm. As the result the gate capacitance of the MOS transistors per data line is as great as 100 fF and for making all of about 60 MOS transistors non-conductive at the write-in of memory information a driver circuit is necessary, which drives an electrostatic capacitance as great as $6_pF$. Further, the potential of the data line, which is lowered to the source voltage $V_{EE}$ when the memory information is written-in, is raised up to the ground potential by this MOS transistor and the data line is prepared for reading out following information. Usually, since an electrostatic capacitance of about $1_pF$ is added to these data lines 810, 811, when their potential is raised with an effective resistance of 500Ω, their time constant is 0.5 ns and therefore it takes a period of time as long as 3 ns for the potential to reach 50 mV, which is the amplitude of the data line at the read out of information. That is, if the read of information is begun during this period of time, the read out time is increased by the period of time for the amplitude of the data line to reach 50 mV. In order to avoid this drawback, it is proposed to use bipolar transistors as load elements of the data line. When the bipolar transistors are used, it can be expected to make the load elements of the data line non-conductive at the write-in as well as to increase the speed to raise the potential of the data line after the write-in. For a bipolar transistor working with a high speed the break-down voltage of the base emitter junction thereof is only about 3 V and it is difficult to make this bipolar transistor non-conductive by lowering the base terminal voltage to the negative source voltage $V_{EE}$, which is −5 V.

Contrary thereto, when Schottky barrier type diodes are used as in this embodiment, since such a Schottky barrier type diode is constituted by a rectifying contact of the collector region of low impurity concentration of a bipolar transistor with metal in a semiconductor integrated circuit, the breakdown voltage thereof is relatively high. Consequently it is possible to obtain a speed as high as that obtained by using bipolar transistors. At the same time the electrostatic capacitance of the anode terminal with respect to the cathode of the diode for making it non-conductive is smaller than 10 fF and it is easy to control it.

Figure 9:
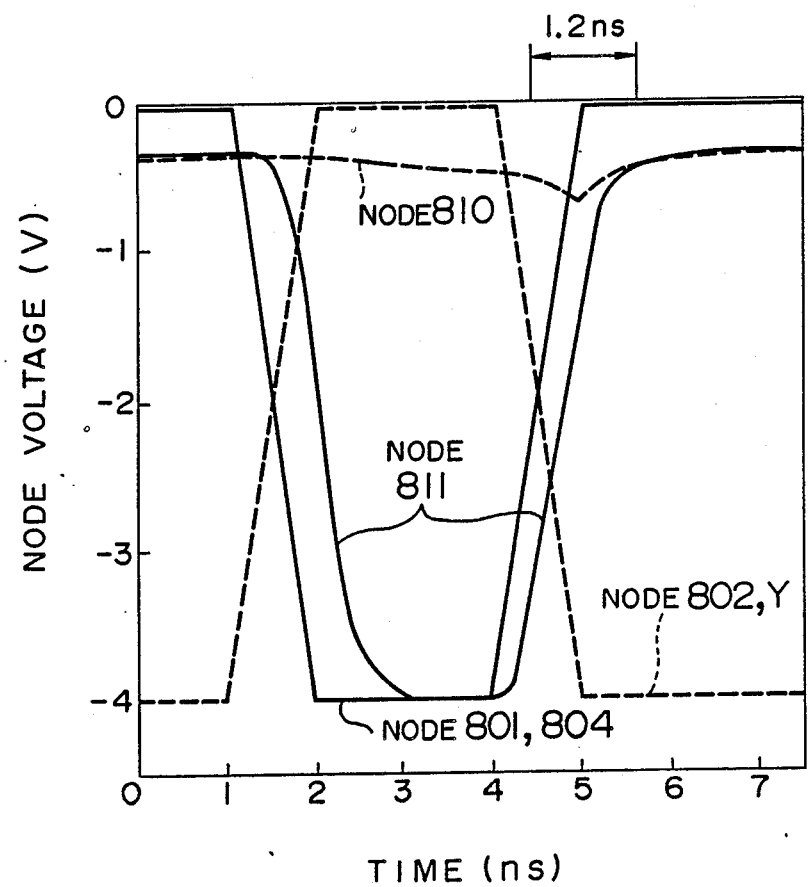
FIG. 9 is a graph indicating variations in the voltage at different nodes in FIG. 8.

FIG. 9 shows characteristic curves indicating variations of the potential of the data line restoring from the source voltage $V_{EE}$ with respect to time, when the circuit indicated in FIG. 8 is used. The time necessary for the potential difference between the pair of data lines to reach 50 mV is about 1.2 ns. This is shorter than that required heretofore, when MOS transistors were used, by a time as much as 1.8 ns.

Figure 10:
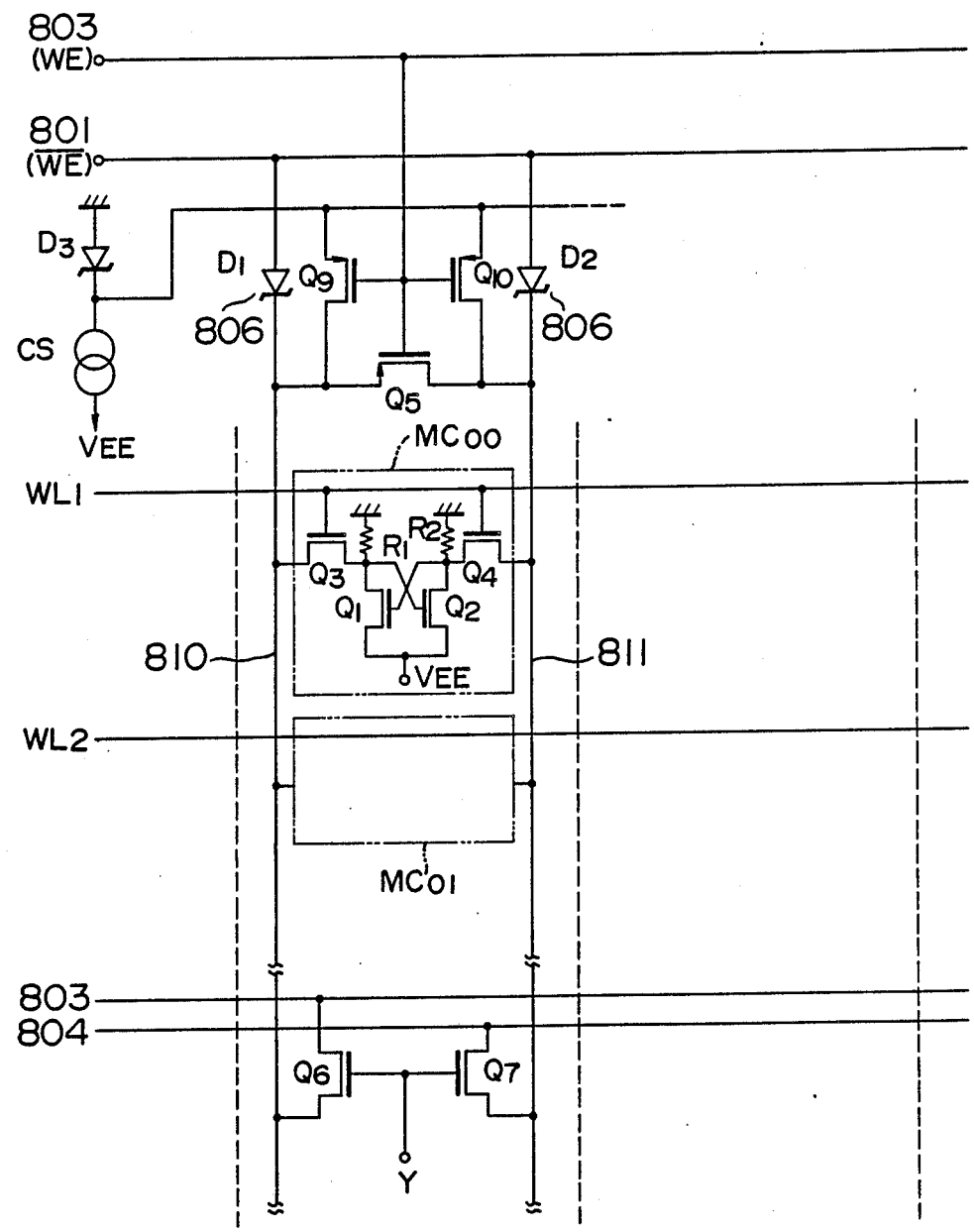
FIG. 10 is a circuit diagram illustrating the construction of load elements of the data line showing an embodiment of this invention.

FIG. 10 is a circuit diagram illustrating the construction of a memory cell, which is a variation of the circuit indicated in FIG. 2. The N channel MOS FET Q5 in FIG. 8 is replaced by a P channel MOS FET $Q_5'$ in FIG. 10. Further other P channel MOS FET Q9 and Q10, other Schottky barrier type diode D3 and a current source CS are additionally disposed.

In the embodiment illustrated in FIG. 8, when the $\overline{WE}$ signal in the line 801 varies as low level→high level→low level due to influences of noises, etc., the Schottky barrier type diodes 806 are cut off; the data lines 810 and 811 are in the no load state; and therefore the potential difference between the data lines 810 and 811 becomes too great. Therefore there was a disadvantage that it took a long time for the potential of the data lines to change into the inverse relation.

Contrary thereto, in the embodiment illustrated in FIG. 10, since the gates of the P channel MOS FETs $Q_5'$, Q9 and Q10 are controlled by the write enable signal WE in the line 803, in their operation state except for the write-in state these MOS FETs $Q_5'$, Q9 and Q10 are conductive. Consequently, even if the Schottky barrier type diodes D1 and D2 are cut-off by variations of the $\overline{WE}$ signal in the line 801, since the cathode potential of another Schottky barrier type diode D3 is supplied to the data lines 810 and 811 through the MOS FETs Q9 and Q10, it is possible to avoid the no load state stated above. Further, in the write-in state, the signal $\overline{WE}$ in the line 801 is at the low level; the diodes D1 and D2 are cut-off, the signal WE is at the high level; and the transistor $Q_5'$, Q9 and Q10 are cut-off, which ensures the write-in of the data to the memory cell.

Now another embodiment of the input buffer circuit according to this invention will be explained.

Figure 11:
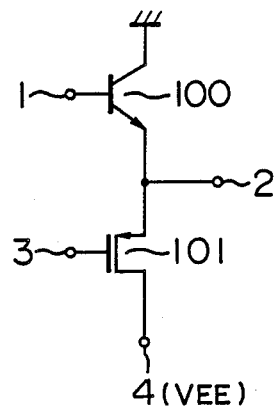
FIG. 11 is a circuit diagram illustrating the construction of an input buffer, which is another embodiment of this invention.

FIG. 11 is a circuit diagram illustrating the construction of an input buffer, which is another embodiment of this invention, indicating the smallest circuit construction, which is an emitter follower circuit. In FIG. 11 a terminal 1 is the input terminal; a terminal 2 is the output terminal; a terminal 3 is the reference voltage applying terminal; a terminal 4 is the negative power source terminal; 100 represents an NPN bipolar transistor; and 101 indicates a P channel type MOS transistor (hereinbelow abbreviated to PMOS). The input buffer constituted by an emitter follower circuit in this embodiment consists of at least one bipolar transistor and one PMOS, as indicated in FIG. 11. In the case where the input voltage is at the high level, e.g. at the ground potential, the voltage which is lowered by the base-emitter voltage $V_{BE}$ e.g., 0.8 V of the NPN transistor 100 is outputted at its emitter terminal 2. At this time the PMOS 101 becomes conductive and the gate voltage of the PMOS 101, i.e. the potential at the terminal 3 is so set that a predetermined emitter bias current $I_{EH}$ flows therethrough. Then, in the case where the input voltage is at the low level, e.g. at −0.8 V, a voltage, which is lower than the input voltage by the base-emitter voltage, is outputted at the output terminal 2. However, at this time, since the source potential of the PMOS 101, i.e. the potential at the output terminal 2 is lower by a potential corresponding to the amplitude of the input signal with respect to the case where the input voltage is at the high level, the gate-source voltage $V_{GS}$ of the PMOS 101 is reduced and the emitter bias current $I_{EL}$ decreases.

Figure 12:
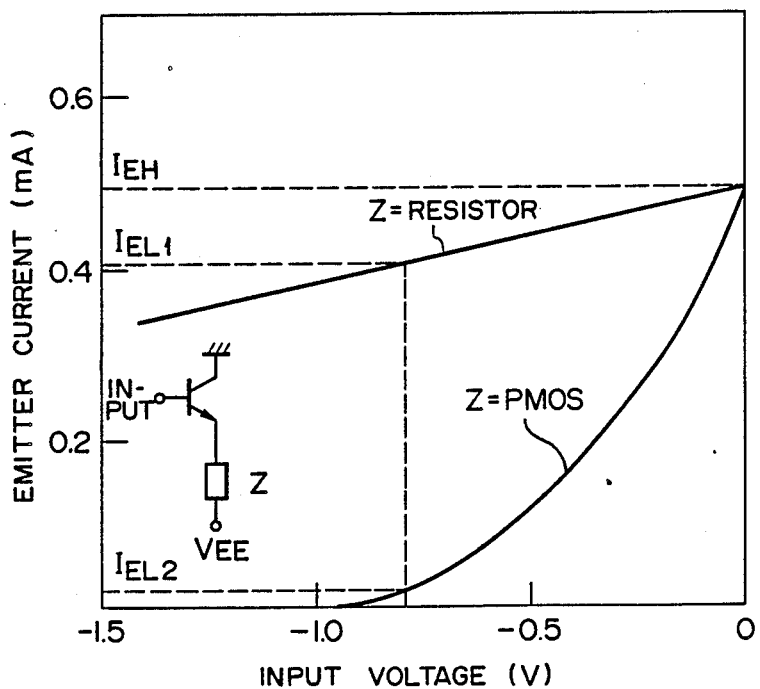
FIG. 12 is a graph showing input voltage vs. emitter current characteristics for the circuit indicated in FIG. 11.

FIG. 12 is a graph showing an example of the input voltage vs. emitter current characteristics for the current indicated in FIG. 11. In the case where a resistance is used instead of the PMOS, supposing that e.g. the source voltage is −5.2 V and the emitter base voltage is 0.8 V, for the high level of 0 V and the low level of −0.8 V of the input voltage, the emitter current varies only by $(I_{EH}-I_{EL})/I_{EH}=0.8/(5.2-0.8)=18\%$. Contrary thereto, in the circuit of this embodiment it is possible to set arbitrarily the emitter current ratio between those obtained at the high level and at the low level of the input voltage, depending on the potential set at the gate 3 of the PMOS 101, as described above, and to try to reduce the electric power consumption in the circuit. Furthermore it is possible to realize a source follower circuit having a similar effect by using an N channel MOS transistor (hereinbelow abbreviated to NMOS) instead of the NPN transistor 100.

Figure 13:
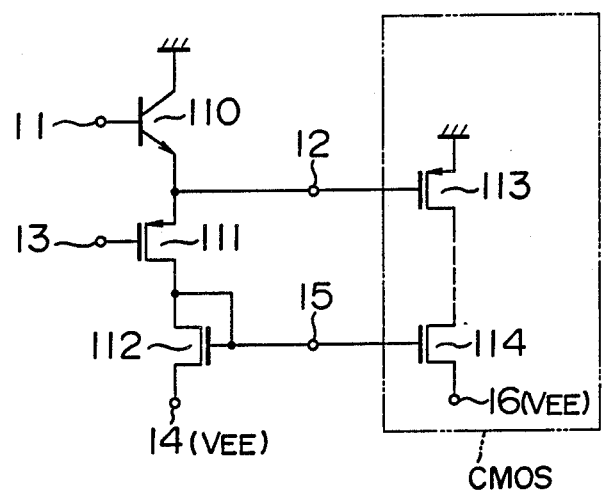
FIG. 13 is a circuit diagram illustrating the construction of an input buffer, which is another embodiment of this invention.

FIG. 11 is a circuit diagram illustrating the construction of an input buffer, which is another embodiment of this invention, constituted by an emitter follower circuit. In FIG. 13, apart from the input terminal 11, the output terminal 12, the reference voltage applying terminal 13, the power source terminal 14, the NPN transistor 110 and the PMOS 111, and NMOS 112 is added between the PMOS 111 and the power source terminal 14 so that an output signal having a signal level different from the level at the output terminal 12 can be taken out from the terminal 15. In this way it is possible to obtain two kinds of output signals suitable for the input signals to the PMOS and the NMOS, respectively, in the CMOS circuit. That is, the circuit of this embodiment is characterized in that variations in the current flowing through the emitter follower circuit are detected by a current mirror circuit constituted by transistors 112 and 114. Supposing that the input signal is e.g. 0 V at the high level and −0.8 V at the low level and that the base emitter voltage $V_{BE}$ is 0.8 V, it is possible to obtain an output signal of −0.8 V at the high level and −1.6 V at the low level at the output terminal 12 as in the embodiment indicated in FIG. 11. This signal is one close to the ground potential and suitable for the input signal to the PMOS in the CMOS circuit of the following stage. On the other hand, as the input signal to the NMOS in the CMOS circuit an output signal having a level close to the voltage applied to the power source terminal 14 is necessary. In FIG. 13 the NPN transistor 110 and the PMOS 111 work just as in the embodiment illustrated in FIG. 12 and it is possible to obtain an output signal suitable for the input signal to the NMOS described above at the terminal 15 owing to the work of the NMOS 112. When the input signal is at the low level, the PMOS 111 is slightly conductive. The emitter current is so small that it flows slightly and the gate potential of the NMOS 112 corresponding to this current, i.e. the potential at the output terminal 15 is higher than the source voltage by a voltage, which is equal to the threshold voltage of the NMOS 112 or slightly higher than it. When the input signal is at the high level, the PMOS 111 is conductive and the emitter bias current flows therethrough. At the same time, corresponding to this current, the gate potential of the NMOS 112 rises and the threshold voltage of the NMOS becomes sufficiently high. Consequently, in the emitter follower circuit indicated in FIG. 13 it is possible to obtain two kinds of output signals suitable for driving CMOS construction circuits so that the circuit can be further simplified and its characteristics can be improved with respect to those obtained in the case where the emitter follower circuit and the current mirror circuit are constructed independently.

Figure 14:
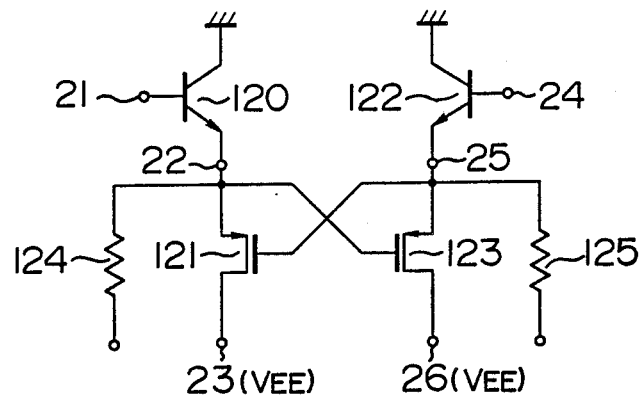
FIG. 14 illustrates similarly the construction of an input buffer, which is a third embodiment.

FIG. 14 is a circuit diagram illustrating the construction of the input buffer circuit using an emitter follower circuit, which is still another embodiment of this invention. In FIG. 14 terminals 21 and 24 are terminals for inputting complementary signals; terminals 22 and 25 are terminals for outputting complementary signals; terminals 23 and 26 are power source terminals; 120 and 122 represent NPN transistors; 121 and 123 PMOSs; and 124 and 125 resistors. In this circuit signals such as output signals from a current mode circuit, which are complementary to each other, are applied to the input terminals 21 and 24 and their output signals are applied to the PMOSs 123 and 121 through the output terminals 22 and 25, respectively. It can be tried to reduce the electric power consumption by making them conductive or non-conductive. When the input signal to the terminal 21 is at the high level, e.g. 0 V, and the input signal to the terminal 24 is at the low level, e.g. −1.5 V, voltages 0.8 V and −2.3 V appear at the output terminals 22 and 25, respectively. Consequently the gate-source voltages VGS of the PMOSs 121 and 123 are −1.5 V and 1.5 V, respectively. If the threshold voltage is e.g. −0.6 V, the PMOS 121 is conductive and the PMOS 123 is non-conductive. When the input signals are inversed, the circuit works similarly, i.e. the PMOS 121 is non-conductive and the PMOS 123 is conductive. The resistors 124 and 125 are disposed for the purpose of making slight bias current flow therethrough. Therefore in the emitter follower circuit of this embodiment no reference voltage is applied to the terminal 3 in FIG. 11, which reduce the electric power consumption of the circuit.

Figure 15:
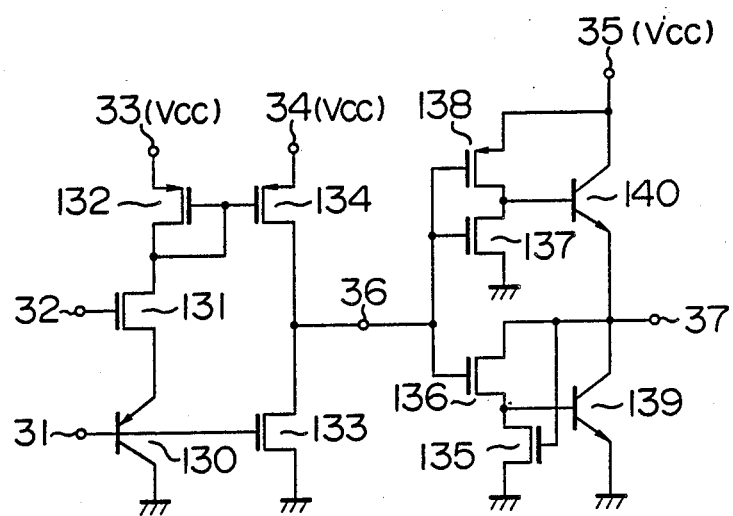
FIG. 15 is a circuit diagram illustrating the construction of a circuit for converting the TTL level into a signal suitable for CMOS circuits, etc., which is another embodiment of this invention.

FIG. 15 is a circuit diagram illustrating of the input buffer circuit, which is still another embodiment of this invention. In FIG. 15 a terminal 31 is the signal input terminal; a terminal 32 is the reference voltage applying terminal; terminals 33 to 35 are positive $V_{cc}$ power source terminals; terminals 36 and 37 are the output terminals; 130 represents a PNP transistor; 139, 140 NPN transistors; 131, 133, 135, 136, 137 NMOSs; and 132, 134, 138 PMOSs. In this circuit a signal having a relatively small amplitude close to the ground potential such as TTL level signals is amplified to a signal having an amplitude close to the source voltage (low level ÷ 0 V, high level ÷ $V_{cc}$) and inputted further to a buffer circuit consisting of MOS transistors and bipolar transistors so as to drive a load. The PNP transistor 130, the NMOS 131 and the PMOS 132 perform operations similar to those of the NPN transistor 110, the PMOS 111 and the NMOS 112 in the embodiment illustrated in FIG. 13. That is, depending on whether the input signal 31 is at the high level or at the low, the NMOS 131 is non-conductive or conductive and it is possible to obtain a high level signal close to the source voltage or a low level signal at its drain electrode which is suitable for the input to the PMOS 134. On the other hand, when the input signal is at the high level, the NMOS 133 becomes conductive and the PMOS 134 becomes non-conductive by applying the input signal to the NMOS 133 and the potential at the output terminal 36 of this level converting circuit is low closely to the ground potential. When the input signal is at the low level, the NMOS 133 is non-conductive and the PMOS 134 is conductive and thus the output terminal 36 is at the high level close to the source voltage. In this embodiment the signal after this level conversion is applied to a buffer circuit consisting of bipolar transistors and MOS transistors 135 to 140 in order to drive a load connected to the output terminal 37. In this way the driving power of this level converting circuit is increased and high speed characteristics are realized.

Since the amplitude of the signal applied to the NMOS 133 or the PMOS 134 is relatively small, the circuit is not suitable for driving a great load. Consequently a higher speed could be obtained by inserting the buffer circuit described above so as to reduce the load connected to the output terminal 36. A CMOS inverter circuit or a multiple input logic gate circuit may be used as the buffer circuit. If vertical type PNP transistors cannot be used, transversal type transistors may be used. It is also possible to construct a source follower circuit by using PMOSs. Further, although the gate electrode of the NMOS 133 is connected with the input terminal 31, supposing an input of TTL level (low level 0.8 V, high level 2.2 V), in this embodiment, depending on the level of the input signal, it may be possible to connect the gate electrode with the emitter terminal of the PNP transistor 130 just as in the embodiment illustrated in FIG. 13. In this way, by using a circuit according to this embodiment it is possible to convert an input signal of TTL level, (0 V−3 V) into a signal (0 V−$V_{cc}$) suitable for a CMOS circuit, etc. with a high speed and to reduce the delay of the signal in the input portion of LSIs.

Figure 16:
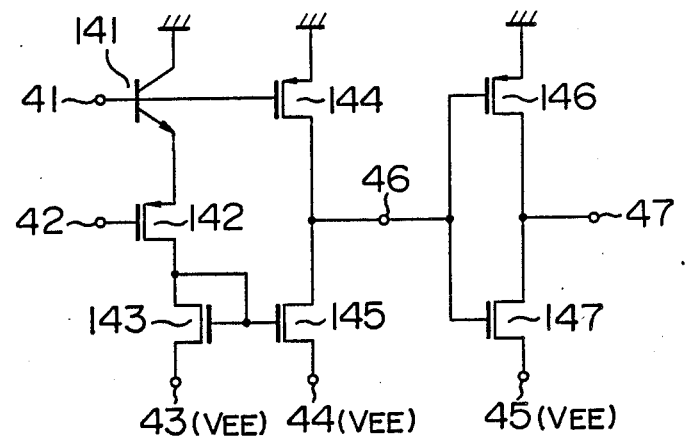
FIG. 16 is a circuit diagram illustrating the construction of a circuit for converting the ECL level into a signal suitable for CMOS circuits, etc., which is a fifth embodiment.

FIG. 16 is a circuit diagram illustrating the construction of the input buffer circuit, which is still another embodiment of this invention. In FIG. 16 a terminal 41 is the signal input terminal; a terminal 42 is the reference voltage applying terminal; terminals 43 to 45 are $V_{EE}$ power source terminals; terminals 46 to 47 are output terminals; 141 represents an NPN transistor; 143, 145, 147 NMOSs; and 142, 144, 146 PMOSs. In this circuit a signal having a small amplitude close to the ground potential such as an ECL level signal is amplified to a signal having an amplitude close to the $V_{EE}$ power source voltage and inputted further to the buffer circuit of CMOS structure so as to drive a load. The NPN transistor 141, the PMOS 142, the NMOS 143, as well as the PMOS 144 and the NMOS 145 in this embodiment perform operations identical to those of the PNP transistor 130, the NMOS 131, the PMOS 132 as well as the NMOS 133 and the PMOS 134 in the embodiment illustrated in FIG. 15. In this way, depending on whether the input signal is at the high level or at the low level, it is possible to obtain a low level signal close to the source voltage or a high level signal at the output terminal 46. The CMOS inverter circuit consisting of the PMOS 146 and receiving this signal, the NMOS 147 can drive the same load as that of the inverter circuit consisting of the transistors 135 to 140 in the embodiment illustrated in FIG. 15. Still another feature of this embodiment consists in that only one bipolar transistor is used, which is the collector grounded NPN transistor 141 so that it can be realized by the usual CMOS process.

Figure 17:
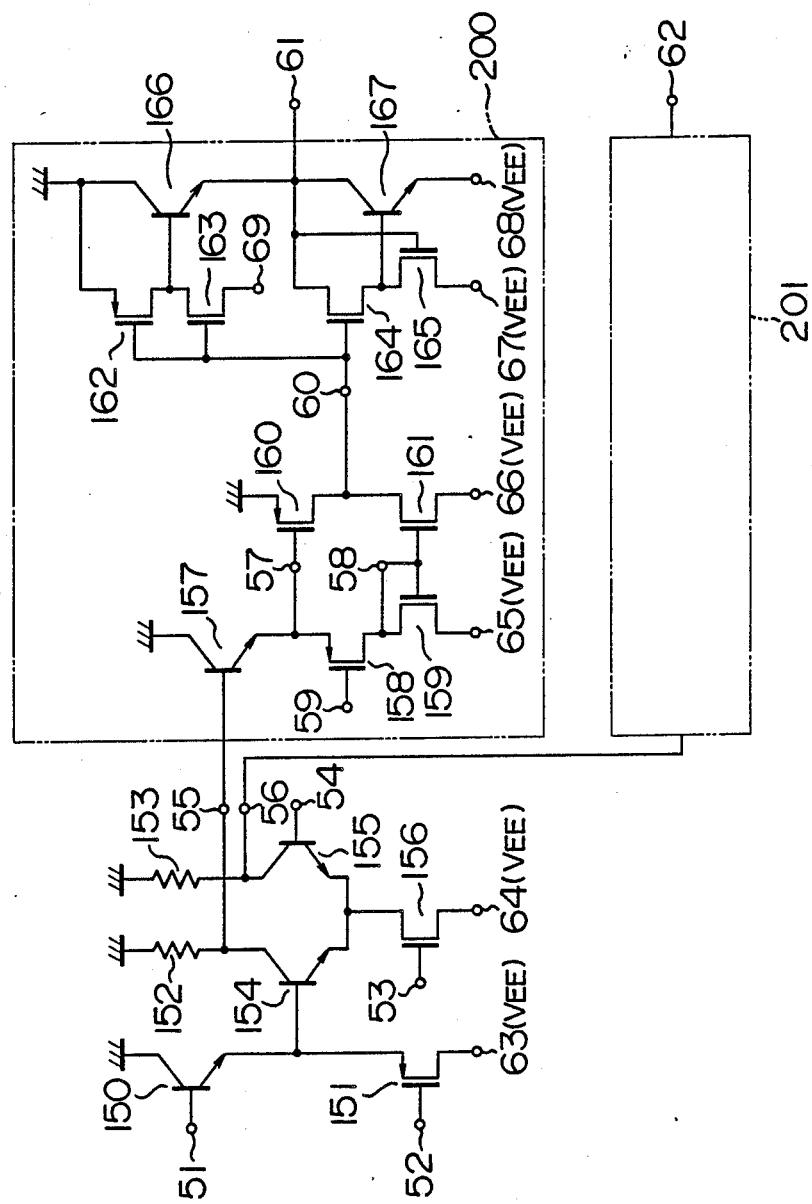
FIG. 17 is a circuit diagram illustrating the construction of a circuit for converting the ECL level into a signal suitable for CMOS circuits, etc., which is another embodiment.

FIG. 17 is a circuit diagram illustrating the construction of the input buffer circuit, which is still another embodiment of this invention. In FIG. 17 a terminal 51 is the signal input terminal; terminals 52-54, 59 are the reference voltage applying terminals; terminals 63 to 69 are the $V_{EE}$ power source terminals; terminals 55-58, 60 are the internal signal terminals; terminals 61, 62 are the output terminals; a circuit 201 is the same circuit as a circuit 200; 150, 154, 155, 157, 166, 167 represent NPN transistors; 156, 159, 161, 163, 164, 165 NMOSs; 151, 158, 160, 162 PMCSs; and 152, 153 resistors. In this circuit an input signal of ECL level is amplified by a current mode circuit consisting of the resistors 152, 153 and the transistors 154, 155, 156 and thereafter level-converted into an amplitude close to the power source voltage by the circuit 200 or 201 so as to drive a load with a high speed. The circuit consisting of the NPN transistor 150 and the PMOS 151 is a circuit for shifting the level of the input signal to a level suitable to the current switching over type circuit in the following stage and works just as explained, referring to FIG. 11. Depending on the setting of the output amplitude of the current mode circuit, in order to prevent the NPN transistors 154 and 155 from becoming saturated, it is also possible to insert a diode or a resistor between the emitter of the NPN transistor 150 and the base of the NPN transistor 154 so as to shift further the signal level. The circuit consisting of the component elements 152 to 156 is a current made circuit and a negation signal and an affirmation signal for the input signal are outputted at the output terminals 55 and 56, respectively, by assigning the potential at the reference voltage applying terminal 54 between the high and the low levels of the base signal of the NPN transistor 154. These signals are amplified by the same level conversion and buffer circuit 200 or 201 as that described, referring to FIG. 16. As the input signal to the buffer circuit 200 or 201 it is desirable for the amplitude of the input signal to be as great as possible, but if it is too great, the delay in the current mode circuit increases excessively. According to an experiment an amplitude of about 1.3 V of the signals at the terminals 55, 56 could make the total delay time shortest and most suitable. Further in the current mode circuit according to this embodiment an NMOS 156 is used. This is a transistor for making the operation of this circuit possible also at a low source voltage. In this way it is possible to supply an almost constant bias current by applying a suitable voltage to the reference voltage terminal 53 so that the NMOS 156 is operated in its saturation region and to make the output amplitude at the terminals 55 and 56 almost constant. The level conversion and buffer circuits 200, 201 are circuits, which are similar to those used in the embodiment illustrated in FIG. 16. Since the high level of the input signals 55, 56 is the ground potential, even if the gate input signal of the PMOS 160 is a signal obtained by level-shifting this ground potential by −0.8 V by means of the transistor 157, the PMOS 160 becomes only slightly conductive, when the NMOS 161 is conductive, and thus it can perform its function. The object for obtaining the gate signal of the PMOS 160 from the base electrode of the transistor 157 consists in that the low level is lowered by 0.8 V with respect to the case where the signal stated above is obtained from the base electrode of the transistor 157 and that the load driving power of the PMOS 160 is increased correspondingly so that the delay time can be shortened. Of course, according to circumstances, they may be connected in the same manner as that described in the embodiment illustrated in FIG. 16. Furthermore, in the buffer circuits 200, 201 in FIG. 17, high speed operation is realized by using a bipolar-CMOS structure inverter circuit having a higher speed explained in the embodiment illustrated in FIG. 15 instead of the CMOS inverter circuit indicated in FIG. 16.

Figure 18:
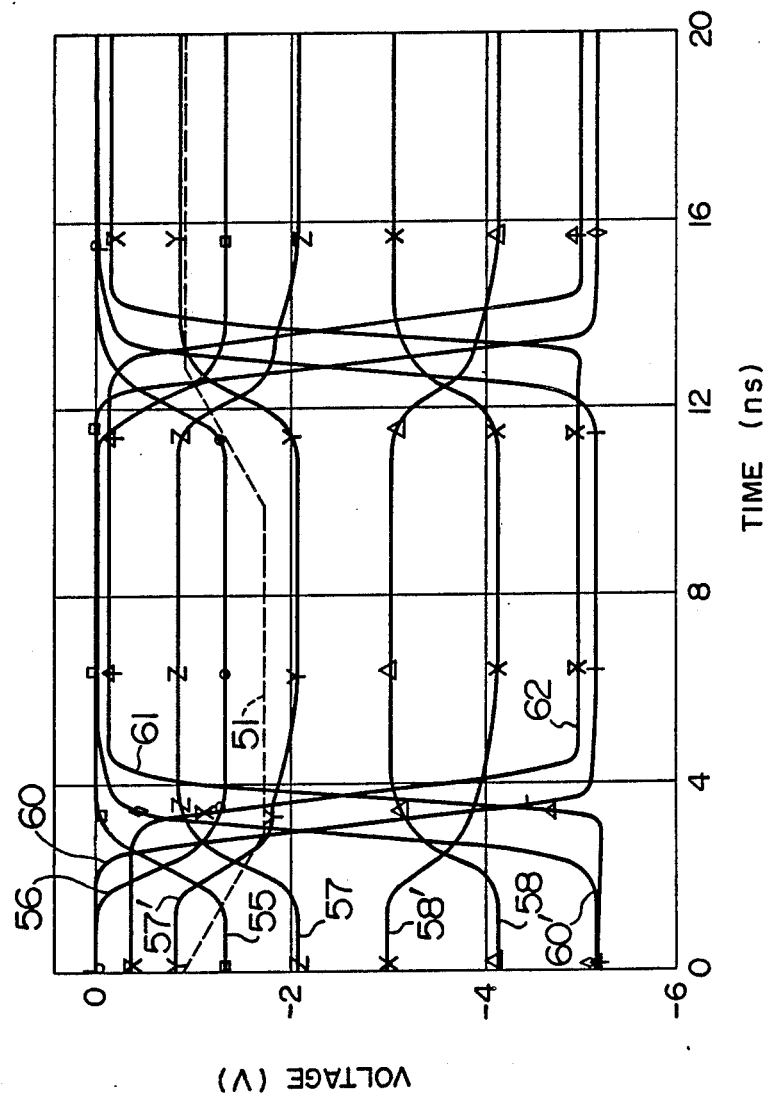
FIG. 18 shows operation waveforms in the circuit indicated in FIG. 17.

FIG. 18 shows operation waveforms in the circuit indicated in FIG. 17. The load capacitance connected with the terminals 61, 62 in FIG. 17 is 1 pF. In FIG. 18 there are indicated the waveform at the input terminal 51 (broken line), same at the output terminals 55 and 56, same at intermediate terminals in the buffer circuit 57, 58 and 60 and same at the load output terminals 61 and 62.

In this way, in the circuit according to this invention, for the ECL inputs (high level −0.9 V, low level −1.7 V), it is possible to obtain the respective negation and affirmation outputs at the terminals 61 and 62 with a delay time of 2.3 ns. Further the electric power consumption is 7 mW at the waiting time and 11 mW at the working time, and its cycle time is 10 ns. Thus the circuit can be operated with a low electric power consumption and with a high speed.

That is, in this embodiment, since the bias current in the emitter follower circuit, through which heretofore an almost constant current was wade flow, is varied, depending on whether the input signal is at the high level or at the low level, it is possible to reduce the electric power consumption. Further, since it is possible to convert signals of ECL or TTL level into signals having a level suitable for CMOS circuits, etc. with a high speed, by utilizing this fact that the bias current is varied, this invention can contribute to improvement of the performance of integrated circuits.

Figure 19:
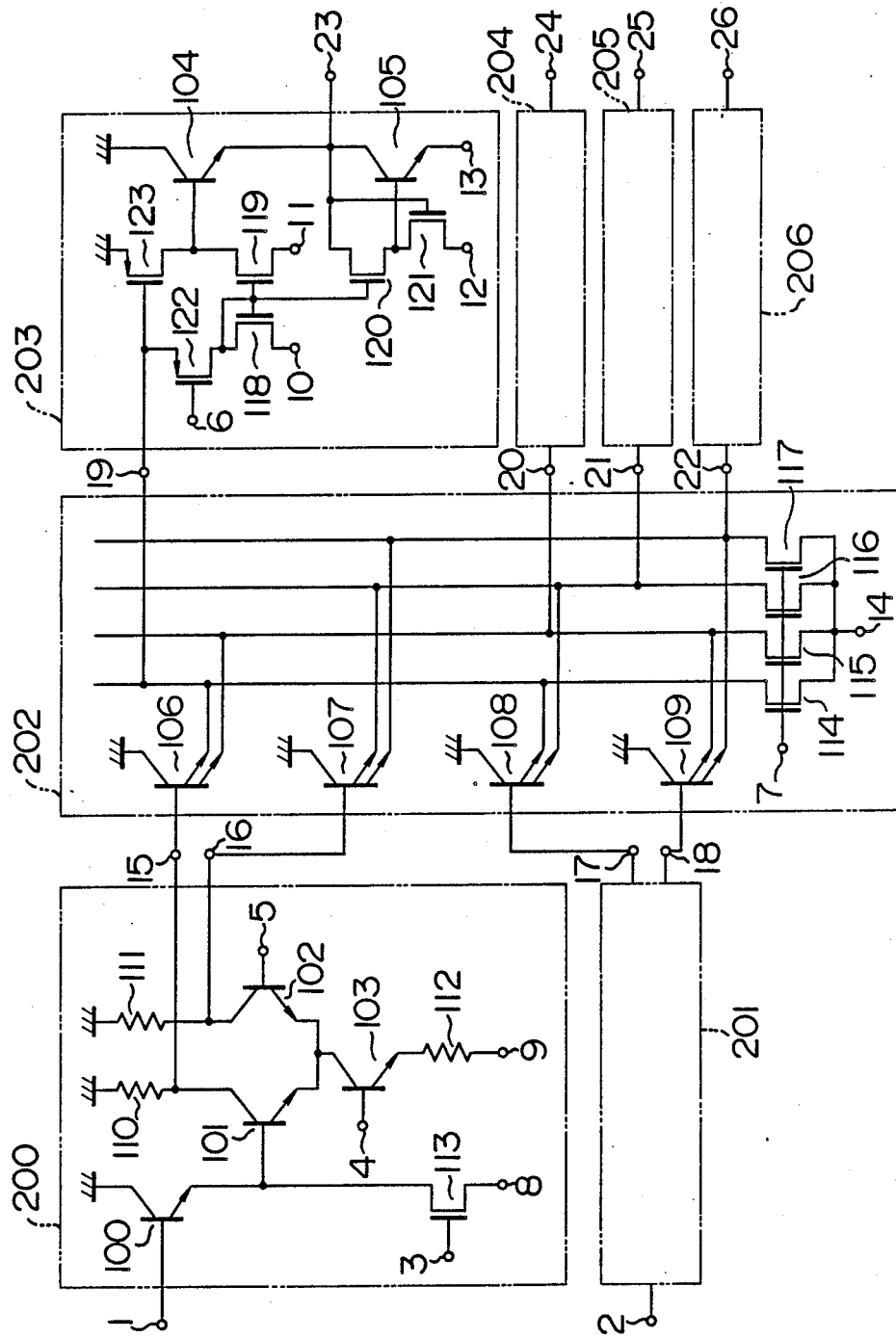
FIG. 19 is a circuit diagram illustrating the construction of a 2-bit decoder circuit, which is another embodiment of this invention.

FIG. 19 is a circuit diagram illustrating the construction of a 2-bit decoder circuit consisting of an input buffer circuit 200, a bipolar logic decoder circuit 202 and a level converting circuit 203, which is an embodiment of the semiconductor integrated circuit device according to this invention. The construction and the operation of the semiconductor integrated circuit device according to this invention will be explained, referring to this circuit diagram.

In FIG. 19 the circuit 200 is an input buffer circuit; the circuit 201 is another input buffer circuit, which is identical to the circuit 200; the circuit 202 is a wired OR logic decoder circuit; the circuit 203 is a level converting circuit; the circuit 204 to 206 are level converting circuits, which are identical to the circuit 203; terminals 1 and 2 are input terminals; terminals 3 to 7 are reference voltage applying terminals; terminals 8 to 14 are power source terminals; terminals 15 to 22 are internal signal terminals; terminals 23 to 26 are output terminals of the circuit blocks stated above; elements 100 to 105 are NPN bipolar transistors (hereinbelow called simply NPN transistors); elements 106 to 109 are multiemitter type NPN bipolar transistors (hereinbelow called simply NPN transistors); elements 110 to 112 are resistors; elements 113 to 121 are N channel type MOS FET (hereinbelow abbreviated to NMOS); and elements 122 and 123 are P channel type MOS FET (hereinbelow abbreviated to PMOS).

In the prior art device, e.g. in a high speed level converting circuit discussed in ISSCC DIGEST OF TECHNICAL PAPERS, (1986) pp. 212–213, since two input signals, which are complementary to each other, are required, the conversion of a signal level to another suitable for signals in internal circuits consisting of MOSs was effected in the step of the input buffer output, where complementary signals existed.

Contrary thereto, in the device according to this invention, since it is possible to level-convert a single input signal 19 without using complementary signals by means of a level converting circuit e.g. in the embodiment illustrated in FIG. 19, high speed bipolar type logic circuits can be integrated. In this way it is possible to replace functional circuit blocks, which were constructed heretofore by MOS type internal circuits, by high speed bipolar type circuits.

Hereinbelow the operation of the 2-bit decoder circuit indicated in FIG. 19 will be explained.

In FIG. 19 the circuits 200, 201 are input buffer circuits, which detect and amplify an input signal of ECL (Emitter Coupled Logic) level inputted to the terminal 1 or 2 and output two signals, which are complementary to each other, at the terminals 15 and 16 or 17 and 18, respectively.

Further the circuit consisting of the NPN transistor 100 and the NMOS 113 is a circuit for shifting the level of the input signal to a signal level suitable for the current mode circuit consisting of the elements 101 to 103 and 110 to 112. It is possible to supply an almost constant bias current thereto by applying a suitable reference voltage to the gate terminal 3 of the NMOS 113 so that the NMOS 113 works in its saturation region.

Of course the constant current circuit may be constituted by usual NPN transistors and resistors, but the construction of the circuit described above is simpler and it can be operated with a low source voltage.

Further, depending on the setting of the output amplitude of the current mode circuit, in order to prevent the saturation of the NPN transistors 101, 102, a diode or a resistor and a capacitive element may be inserted between the emitter of the NPN transistor 100 and the base of the NPN transistor 101 in order to shift further the level.

Then the current mode circuit works so as to output the affirmation and the negation signals for the input signal at the output terminals 15 and 16, respectively, by assigning the potential at the terminal 5 between the high and the low levels of the base signal of the NPN transistor 101.

Furthermore the circuit consisting of the NPN transistor 103 and the resistor 112 is a constant current source circuit and in the case where the precision in the intensity of the current is not required, it may be constituted only by an NMOS as stated previously.

When the amplitude of the input signal of the level converting circuit in the following stage is taken into account, the amplitude of the output signal of the current switching over circuit stated above is preferably as large as possible, but if it is too large, the delay time in the current switching over circuit portion increases excessively. On the other hand it should be so designed that the NPN transistors 101 and 102 are not saturated. According to an experiment a voltage of about 1.4 V is most suitable for the output signal stated above.

Next the decoder circuit 202 is a wired OR logic circuit, and when even one of the bases of the multiemitter type NPN transistors connected with the output terminals thereof (terminals 19, 20, 21, 22) is at the high level, it outputs a high level signal at its output terminal and when all the base potentials are at the low level, it outputs a low level signal at its output terminal.

Consequently decode signals (low level selection) for the input signal to the terminals 1 and 2 are outputted at the terminals 19 to 22 by inputting an affirmation and a negation signal of the input buffer circuit, as indicated in FIG. 19, and wiring the elements as illustrated therein. For example, in the case where both the potentials at the terminals 1 and 2 are at the low level, the terminals 15 and 17 are at the high level and the terminals 16 and 18 are at the low level. Therefore the output terminals are so selected that the terminals 19 to 21 are at the high level and the terminal 22 is at the low level.

Further the NMOSs 114 to 117 are disposed for the purpose of supplying the bias current to the emitter follower circuit just as the NMOS 113.

In addition it is a matter of course that the multiemitter type NPN transistors 106 to 109 may be constructed by connecting the bases and the collectors of single emitter type NPN transistors.

Next the circuits 203 to 206 are circuits for converting the level of the decoded signal stated above to a signal level suitable for internal circuits of MOS structure in the following stage.

In the circuit described above, supposing e.g. that the output amplitude of the input buffer circuit 200 is 1.4 V and that the amount of the level shift of the emitter follower circuit is 0.8 V, a signal, which is −0.8 V at the high level and −2.2 V at the low level, is inputted to the input terminal 19. In this way it is possible to make the PMOS 122 conductive, when the source potential thereof is at the high level, and non-conductive or slightly conductive, when it is at the low level, by applying the signal stated above to the source terminal thereof and a suitable reference voltage to the gate terminal 6 thereof.

Figure 20:
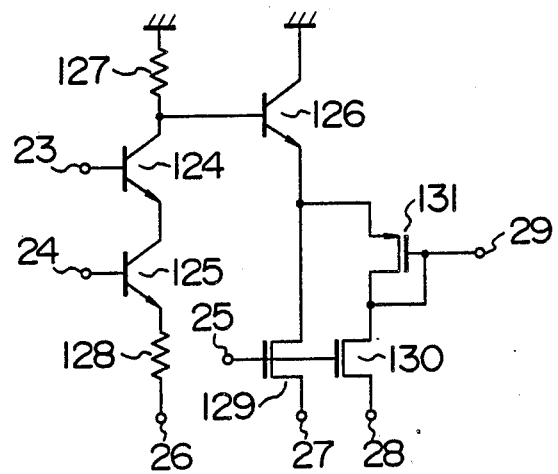
FIG. 20 is a circuit diagram illustrating an embodiment of the reference voltage generating circuit for the level converting circuit constituting a device according to this invention.

FIG. 20 is a circuit diagram illustrating an embodiment of the circuit generating the reference voltage applied to the terminal 6.

In FIG. 20, terminals 26 to 28 are power source terminals. A circuit consisting of NPN transistors 124 to 126, resistors 127, 128 and an NMOS 129 is one simulating the NPN transistors 102, 103, 106, the resistors 111, 112 and the NMOS 114 in FIG. 19. Supposing that the various parameters of the elements are identical to those presumed for FIG. 19, the source potential of the PMOS 131 is same as the low level at the terminal 19 indicated in FIG. 19, when the same voltage as that applied to the terminals 4, 5, 7 is applied to the reference voltage applying terminals 23 to 25. Consequently the substrate bias effect is equal for the PMOSs 122 and 131. The NMOS 130 supplies a slight bias current (e.g. several tens of μA) to the PMOS 131. Therefore the PMOS 131 becomes slightly conductive and the potential at the gate terminal 29 is slightly lower than the threshold voltage thereof.

A current, which is approximately equal to a value obtained by multiplying the current flowing through the PMOS 131 by the ratio of the gate widths of the PMOSs 131 and 122, flows through the PMOS 122, when the terminal 19 is at the low level, by driving this PMOS 131 and the PMOS 122 in FIG. 19 in their saturation region. On the contrary, when the terminal 19 is at the high level, the gate-source voltage of the PMOS 122 is raised by the amplitude of the signal with respect to that described above and the PMOS 122 becomes strongly conductive. Further, depending on the current flowing through the PMOS 122, the gate voltage of the NMOS 118 can be nearly at its threshold voltage, when the input voltage at the terminal 19 is at the low level, and at a high level, which is sufficient for making the NMOSs 119 and 120 conductive, when it is at the high level.

On the other hand, by applying the input voltage of the level converting circuit at the terminal 19 to the gate terminal of the PMOS 123 the PMOS 123 is conductive, when the potential at the terminal 19 is at the low level, and the PMOS 122 and NMOS 119 are non-conductive or slightly conductive, when it is at the low level.

By the operation described above the voltage applied to the terminal 19, whose level is to be converted, is transformed into two signals, which are in phase, suitable for the input signal to each of the MOS FETs in the CMOS inverter circuit consisting of the PMOS 123 and the NMOS 119. In this way the CMOS' inverter circuit can perform its complementary operation and it is possible to obtain a signal, whose level is converted so as to have an amplitude approximately equal to the power source voltage, at the drain terminal, which is its output terminal.

Of course MOS type internal circuits in the following stage may be driven by the signal stated above. However in the embodiment illustrated in FIG. 19 a circuit consisting of NPN transistors 104, 105 and NMOSs 120, 121 is added in order to obtain a large load driving power. That is, when the potential at the terminal 19 is at the low level, the drain current of the PMOS 123 is amplified by the NPN transistor 104 in order to drive the load and when it is at the high level, the source current of the NMOS 120 is amplified by the NPN transistor 105 in order to drive the load.

Further, since the NPN transistors 104 and 105 perform a complementary operation, there is no steady current flowing therethrough and it is possible to obtain a level-converted signal, which is suitable for the MOS type internal circuits, similar to the output of a usual CMOS logic circuit, with a high speed at the output terminal 23.

Further, in the embodiment illustrated in FIG. 19, although only NMOSs 114 to 117 are disposed as a bias current source for the emitter follower circuits, it may be also possible to make use of the current flowing through the NMOS 118 as the bias current source without using the NMOSs 114 to 117.

As explained above, in the semiconductor integrated circuit device according to this embodiment, since it is possible to convert the level of a single signal with a high speed by means of level converting circuit 203 to 206, it can be so constructed that logic operation is effected by means of a high speed wired OR logic circuit before the level conversion so as to construct a high speed decoder circuit, contrary to the fact that heretofore decoding was effected by means of MOS type logic circuits after the level conversion.

In addition, although a 2-bit decoder circuit is shown in the embodiment illustrated in FIG. 19, it is a matter of course that this invention can be applied equally well to decoder circuits, whose number of bits is greater than 2. Furthermore, although there is shown an embodiment, where the wired OR logic circuit is connected as a decoder circuit, other connections are of course possible.

In an experiment the level converting circuit represented by the circuit 203 could effect the level conversion with a speed, which is almost equal to that of a prior art level converting circuit, to which two complementary signals were inputted, with the same electric power consumption as that of the latter.

In addition the speed of the wired OR logic circuit was satisfactorily high with respect to that of a prior art logic circuit, which was operated by signals having a large amplitude.

Consequently the decoder circuit according to this embodiment can be operated with a higher speed, corresponding to the decoding time of the decoder circuit described above, with the same electric power consumption with respect to the prior art decoder circuit constituted by a level converting circuit, to which two signals are inputted, and a logic circuit, which is operated by signals having a large amplitude.

Figure 21:
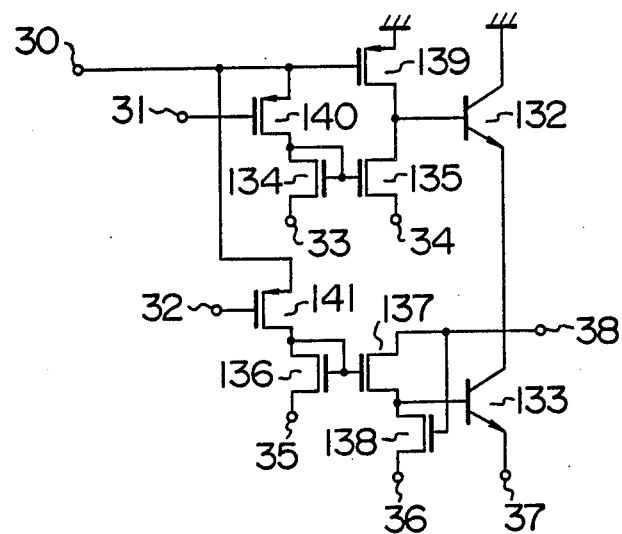
FIG. 21 is a circuit diagram illustrating an embodiment of the level converting circuit stated above.

Next FIG. 21 is a circuit diagram illustrating another embodiment of the level converting circuit constituting a semiconductor integrated circuit device according to this invention.

In FIG. 21 a terminal 30 is the input terminal for signals whose level is to be converted; terminals 31, 32 are the reference voltage applying terminals; terminals 33 to 37 are power source terminals; a terminal 38 is the output terminal for signals whose level is converted; elements 132, 133 are NPN transistors; elements 134 to 138 are NMOSs; and elements 139, 140, 141 are PMOSs.

In the level converting circuit according to this embodiment there are disposed two level shifting circuits consisting of the PMOS 122 and the NMOS 118 in the level converting circuit of the embodiment illustrated in FIG. 19. These two level shifting circuits are a circuit consisting of a PMOS 140 and an NMOS 134 and a circuit consisting of a PMOS 141 and an NMOS 136. This embodiment is characterized in that these circuits drive separately NMOSs 135 and 137.

Since the operation itself of the level shifting circuit and the elements 132, 133, 135, 137, 138 and 139 is similar to that of the corresponding circuit and elements of the level converting circuit 200 in the embodiment illustrated in FIG. 19, explanation thereof will be omitted.

Figure 22:
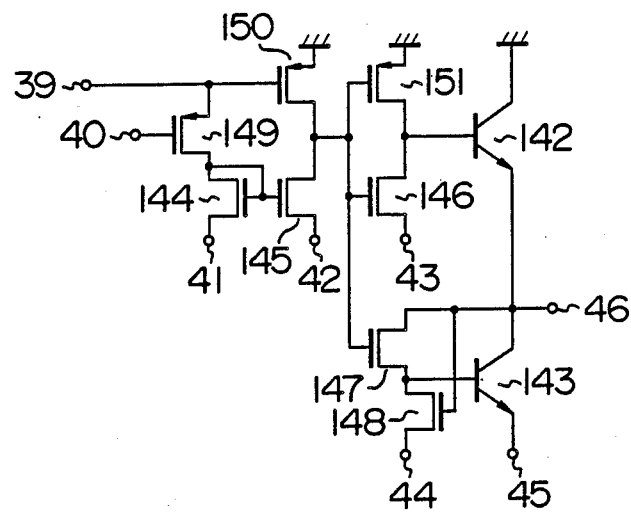
FIG. 22 is a circuit diagram illustrating another embodiment of the level converting circuit.

Next FIG. 22 shows a circuit diagram illustrating another embodiment of the level converting circuit constituting the semiconductor integrated circuit device according to this invention.

In FIG. 22 a terminal 39 is the input terminal of the signal whose level is to be converted; a terminal 40 is the reference voltage applying terminal; terminals 41 to 45 are power source terminals; a terminal 46 is the output terminal of the signal whose level is converted; elements 142, 143 are NPN transistors; elements 144, 148 are NMOSs; and elements 149 to 151 are PMOSs.

The level converting circuit according to this embodiment is characterized in that, after having obtained a level-converted signal as the output of the inverter circuit consisting of the PMOS 150 and the NMOS 145 just as the level converting circuit 203 in the embodiment illustrated in FIG. 19, this signal is applied to a BiCMOS inverter circuit consisting of bipolar transistors and CMOSs in order to drive the load.

In this embodiment the operation of the level converting part consisting of the elements 144, 145, 149, 150 is the same as that of the level converting part consisting of the elements 118, 119, 122, 123 in the embodiment illustrated in FIG. 19.

In the embodiment illustrated in FIG. 19 the output of the level converting part described above is directly inputted to the base of the NPN transistor and the output of the level shifting part, i.e. the drain voltage of the NMOS 118 is directly inputted to the NMOS 120 in order to drive the load. Consequently, taking into account, that the number of stages of the circuit in the embodiment illustrated in FIG. 19 is smaller than that of the level converting circuit in the embodiment illustrated in FIG. 22, the speed of the former is higher than that of the latter. However, depending on the capacity of the load, in order to drive a large capacity, it is necessary that the gate width of the PMOS 151 and the NMOS 147 or the PMOS 123 and the NMOS 120 of the embodiment illustrated in FIG. 19 is designed to be great. In such a case, in the embodiment illustrated in FIG. 19 the delay at the level shifting part and the level converting part increases excessively and thus it may happen that as a whole the speed of the circuit of the embodiment illustrated in FIG. 22 is higher. Therefore, taking this aspect into account, the circuit of the embodiment illustrated in FIG. 22 has an advantage to have a larger freedom of the circuit design.

Further, contrary to the fact that the level converting circuit of the embodiment illustrated in FIG. 19 functions as an inverter circuit, the level converting circuit indicated in FIG. 22 functions as a non-inverter circuit. Consequently an advantage can be obtained that a low level selecting circuit is constructed e.g. by replacing the level converting circuit of the embodiment illustrated in FIG. 19 by the circuit indicated in FIG. 22, which has an effect to increase the freedom of the circuit design.

Figure 23:
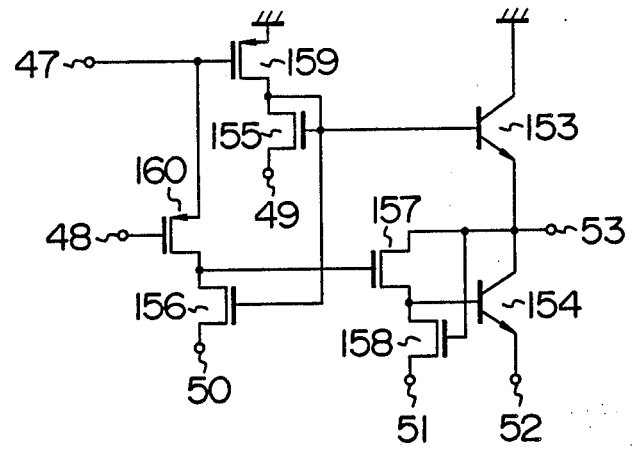
FIG. 23 is a circuit diagram illustrating still another embodiment of the level converting circuit.

FIG. 23 is a circuit diagram illustrating still another embodiment of the level converting circuit constituting the semiconductor integrated circuit device according to this invention.

In FIG. 23 a terminal 47 is the input terminal for the signal whose level is to be converted; a terminal 48 is the reference voltage applying terminal; terminals 49 to 52 are power source terminals; a terminal 53 is the output terminal for the signal whose level is converted; elements 153, 154 are NPN transistors; elements 155 to 158 are NMOSs; and elements 159, 160 are PMOSs.

The level converting circuit according to this invention is characterized in that in the level shifting part consisting of the PMOS 160 and the NMOS 156 the gate terminal of the NMOS 156 is not connected with the reference voltage applying terminal but with the output of another level shifting part consisting of the PMOS 159 and the NMOS 155 so that the NMOS 156 is non-conductive, when the potential at the input terminal 47 is at the high level.

In this embodiment, since the operation of the buffer part consisting of the elements 153, 154, 157 and 158 is the same as that of the level converting circuit 203 of the embodiment illustrated in FIG. 19, explanation thereof will be omitted.

The level shifting part consisting of the PMOS 159 and the NMOS 155 in this embodiment works as follows and generates a signal suitable for the input signal of NMOSs, which is similar to that obtained by the level shifting part consisting of the PMOS 122 and the NMOS 118 of the embodiment illustrated in FIG. 19.

That is, the PMOS 159 is conductive, when the potential at the input terminal 47 is at the low level, and slightly conductive, when it is at the high level, and a high level signal and a low level signal, which is approximately equal to the threshold voltage, respectively, are outputted at its drain terminal. On the contrary the level shifting part consisting of the PMOS 160 and the NMOS 156 works similarly to the level shifting part consisting of the PMOS 122 and the NMOS 118 of the embodiment illustrated in FIG. 19. That is, the PMOS 160 is slightly conductive, when the potential at the input terminal 47 is at the low level, and conductive, when it is at the high level, and a low level signal and a high level signal, respectively, is outputted at its drain terminal.

Differently from the embodiment illustrated in FIG. 19, in the embodiment illustrated in FIG. 23 the gate terminal of the NMOS 156 is connected with the output of the level shifting part described above, i.e. the drain terminal of the PMOS 159, while in FIG. 19 the gate terminal of the NMOS 118 is connected with the drain terminal thereof. Consequently the NMOS 156 is only slightly conductive, even when the PMOS 160 is conductive.

By the construction described above the level converting circuit of the embodiment illustrated in FIG. 23 is characterized in that the electric power consumption is low for the high level input, while the electric power consumption of the level converting circuit of the embodiment illustrated in FIG. 19 is low, when the input voltage is at the low level.

Figure 24:
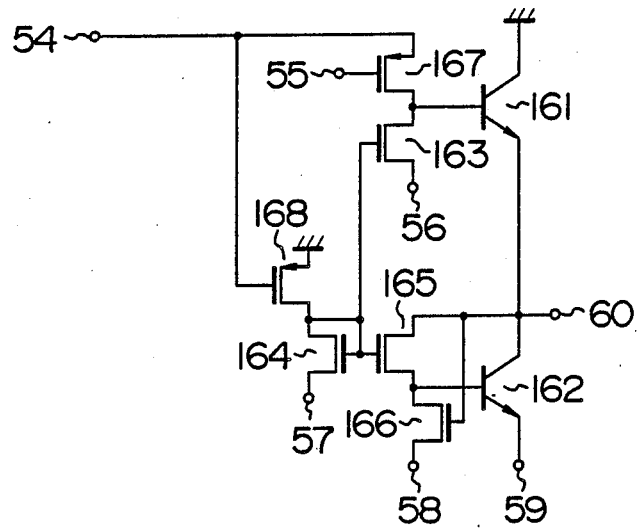
FIG. 24 is a circuit diagram illustrating still another embodiment of the level converting circuit.

FIG. 24 is a circuit diagram illustrating still another embodiment of the level converting circuit constituting the semiconductor integrated circuit device according to this invention.

In FIG. 24 a terminal 54 is the input terminal for the signal whose level is to be converted; a terminal 55 is the reference voltage applying terminal; terminals 56 to 59 are power source terminal; a terminal 60 is the output terminal for the signal whose level is converted, elements 161, 162 are NPN transistors; elements 163 to 166 are NMOSs; and elements 167, 168 are PMOSs.

In the level converting circuit according to this embodiment the level shifting part consisting of the PMOS 167 and the NMOS 163 and the level shifting part consisting of the PMOS 168 and the NMOS 164 work similarly to the level shifting part consisting of the PMOS 160 and the NMOS 156 and the level shifting part consisting of the PMOS 159 and the NMOS 155 of the embodiment illustrated in FIG. 23. Further, since the output buffer part consisting of the elements 161, 162, 165, 166 works similarly to the output buffer part consisting of the elements 153, 154, 157, 158 of the embodiment illustrated in FIG. 23, explanation thereof will be omitted.

The level converting circuit according to this embodiment is characterized in that the elements driving the two level shifting parts described above are disposed inversely with respect to those of the embodiment illustrated in FIG. 23, thus it functions as a non-inverter circuit, and its electric power consumption is low, when the input voltage is at the high level.

Figure 25:
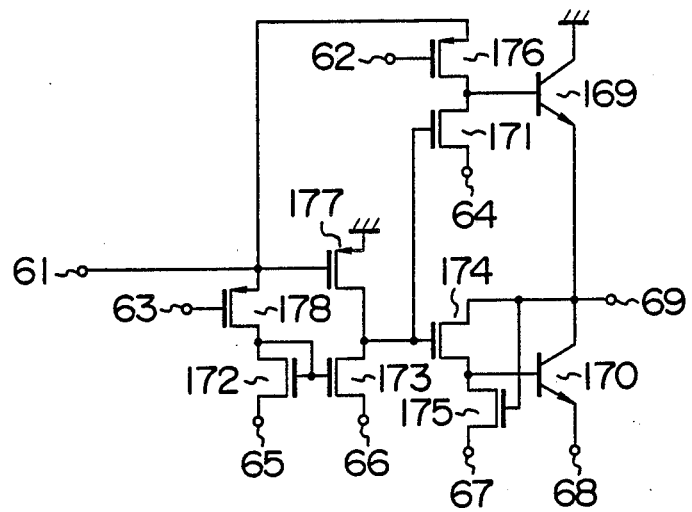
FIG. 25 is a circuit diagram illustrating still another embodiment of the level converting circuit.

FIG. 25 is a circuit diagram illustrating still another embodiment of the level converting circuit constituting the semiconductor integrated circuit device according to this invention.

In FIG. 25 a terminal 61 is the input terminal for the signal whose level is to be converted; terminals 62, 63 are reference voltage applying terminals; terminals 64 to 68 are power source terminals; a terminal 69 is the output terminal for the signal whose level is converted; elements 169, 170 are NPN transistors; elements 171 to 175 are NMOSs; and elements 176 to 178 are PMOSs.

Since, in the level converting circuit according to this embodiment, the level converting part consisting of the elements 172, 173, 177, 178 and the elements except for the PMOS 176 in the output buffer circuit consisting of the elements 169 to 171 and 174 to 176 work similarly to the level converting part consisting of the element 144, 145, 149, 150 and the elements 142, 143, 146 to 148, 151 in the output buffer circuit of the embodiment illustrated in FIG. 22, explanation thereof will be omitted.

The level converting circuit of this embodiment is characterized in that the signal, which is inputted in the PMOS 176 driving the NPN transistor 169, is not taken out from the output of the level converting part, as indicated in FIG. 22, but it is taken out from the input terminal 61. This PMOS 176 is slightly conductive, when the input signal is at the low level, just as the PMOS 151 of the embodiment illustrated in FIG. 22, and conductive, when it is at the high level, and works so as to drive the NPN transistor 169.

Constructed as described above, since the path for driving the NPN transistor 169 is short, the level converting circuit according to this invention has an advantage to be operated with a high speed.

Figure 26:
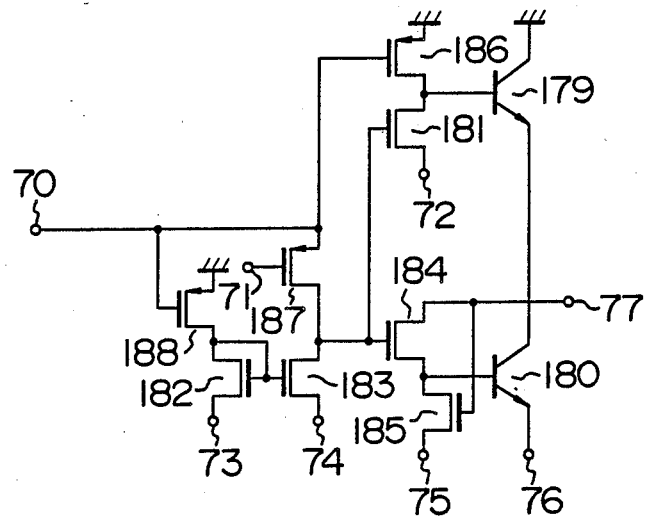
FIG. 26 is a circuit diagram illustrating still another embodiment of the level converting circuit.

FIG. 26 is a circuit diagram illustrating still another embodiment of the level converting circuit according to this invention.

In FIG. 26 a terminal 70 is the input terminal for the signal whose level is to be converted; a terminal 71 is the reference voltage applying terminal; terminals 72 to 76 are power source terminals; a terminal 77 is the output terminal for the signal whose level is converted; elements 179, 180 are NPN transistors; elements 181 to 185 are NMOSs; and elements 186 to 188 are PMOSs.

Since, in the level converting circuit according to this embodiment, the level converting part consisting of the elements 182, 183, 187, 188 and the elements 179, 180, 184, 185 in the output buffer circuit work similarly to the level shifting part consisting of the elements 155, 156, 159, 160 and the elements 153, 154, 157, 158 in the output buffer circuit of the embodiment illustrated in FIG. 23, explanation thereof will be omitted.

The level converting circuit according to this embodiment is characterized in that the input signal to the PMOS 186 driving the NPN transistor 179 is taken out from the input terminal 70, which is same as in the embodiment illustrated in FIG. 23, but the gate input of the NMOS 181 is taken out from the output of the level shifting part.

That is, in this embodiment the NMOS 181 is only slightly conductive, when the PMOS 186 is conductive, while in the embodiment illustrated in FIG. 23 the NMOS 155 is conductive, when the PMOS 159 is conductive. Consequently the base potential of the NPN transistor 179 rises to a level close to the ground potential at the high level output. In this way an advantage can be obtained that the output high level at the terminal 77 is higher than that obtained by the embodiment illustrated in FIG. 23.

Although various embodiments of the level converting circuit constituting the semiconductor integrated circuit device according to this invention, have been explained in the above, referring to FIGS. 19 and 21 to 26, the construction of the level converting circuit is not restricted to those described above.

For example it may be also so constructed that the gate terminal of the NMOS (e.g. the NMOS 184 in FIG. 26) driving the NPN transistors in the buffer circuit part is connected with the output terminal (terfminal 77); the source terminal thereof with the input terminal (the darin terminal of the NMOS 183); and the drain terminal with the base terminal of the driving NPN transistor (NPN transistor 180). Further another construction, by which the NMOSs (e.g. the NMOS 181 or 185 in FIG. 26) for removing base electric charge are replaced by resistors, are also possible. Further, although the output amplitude is lower than the source voltage in the output circuit construction in the embodiments, which are constructed by NPN transistors and a CMOS circuit, it is also possible to obtain a signal whose level is converted, having an amplitude, which is equal to the power source voltage, by inserting a PMOS or NMOS between the output terminal and the power source, of necessary, and applying a suitable signal existing within the level converting circuit to the gate terminal (e.g. in the embodiment illustrated in FIG. 26, the signal at the terminal 70 to the gate terminal to the PMOS and the signal at the gate terminal of the NMOS 184 to the gate terminal of the NMOS). Furthermore, the level converting circuit can have a logic function by constructing it so that the MOS transistor driving the NPN transistor has a NAND or NOR structure used in a usual CMOS or BiCMOS logic circuit (e.g. by connecting a plurality of PMOSs 186 in parallel and a plurality of NMOSs 181 and 184 in series, respectively, in the embodiment illustrated in FIG. 26).

Figure 27:
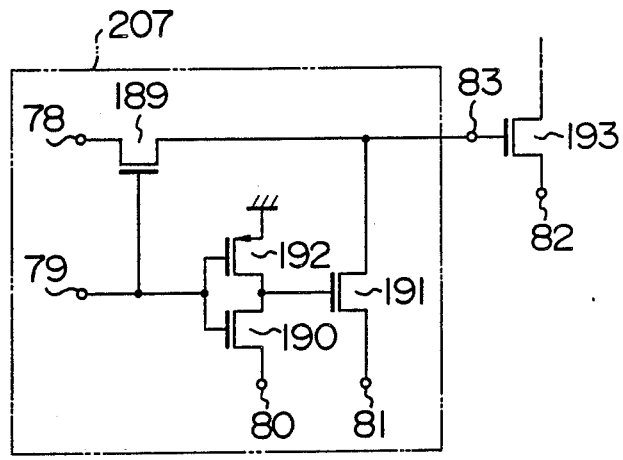
FIG. 27 is a circuit diagram illustrating an embodiment of the reference voltage applying circuit applying the reference voltage to the circuits constituting the device according to this invention.

In addition, as indicated in FIG. 27, it may be so constructed that the reference voltage described above is applied to the terminal 78; at the same time the gate terminal of the NMOS stated above (the NMOS 193 in FIG. 27) is connected with the terminal 83; and the reference voltage or the power source voltage is applied to the terminal 83 by means of the circuit 207, depending on the high or low level at the signal input terminal 79, so that the NMOS 193 is conductive or non-conductive. In FIG. 27 a terminal 78 is the reference voltage applying terminal; a terminal 79 is the signal input terminal; terminals 80, 81 are power source terminals; a terminal is the output terminals; elements 189 to 191, 193 are NMOSs; and an element 192 is a PMOS. In this circuit the NMOS 189 is conductive and the NMOS 191 is non-conductive, when the signal input terminal 79 is at the high level, so that the potential at the output terminal 83 is equal to the potential at the reference voltage applying terminal 78. On the contrary, when the signal input terminal 79 is at the low level, the NMOS 189 is non-conductive and the NMOS 191 is conductive so that the potential at the output terminal 83 is the power source potential. It is a matter of course that it is possible to interrupt the current flowing through the NMOSs 113 to 117, when they are not necessary, by adding this circuit similarly to the gate terminals of the NMOSs 113 to 117 of the embodiment illustrated in FIG. 19.

Figure 28:
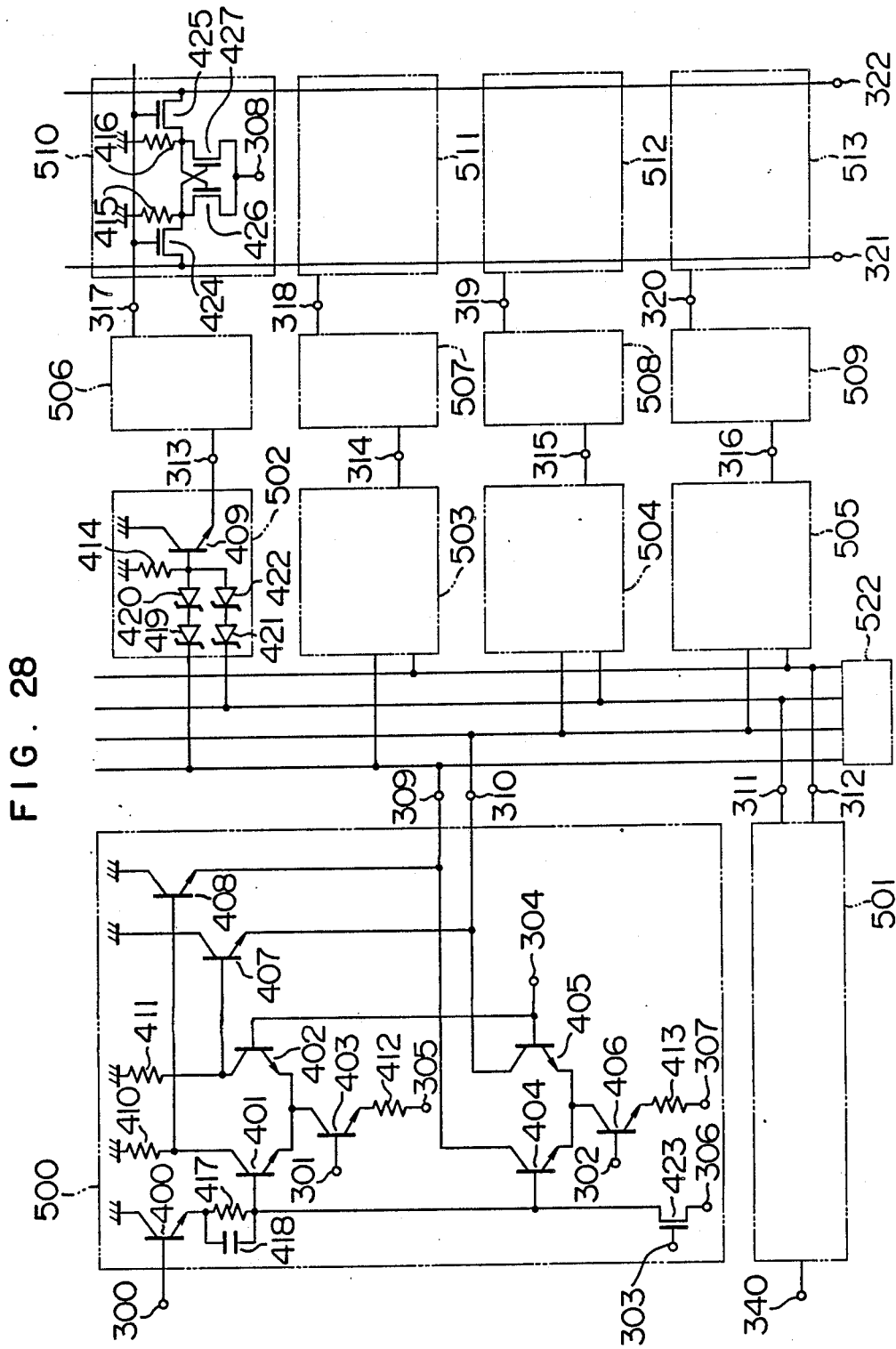
FIG. 28 is a circuit diagram illustrating the construction of the 2-bit decoder and the memory cell array in another embodiment of this invention.

Next the FIG. 28 is a circuit diagram illustrating the construction of an embodiment of the memory array selection circuit in a semiconductor memory device, which is another embodiment of the semiconductor integrated circuit device consisting of an input buffer circuit according to this invention, a bipolar logic circuit, a level converting circuit and MOS type internal circuits.

For the sake of simplifying explanation a 2-bit word decoder circuit and 4 memory cell array are indicated in FIG. 28.

In FIG. 28 a circuit 500 is an input buffer circuit; a circuit 501 is another input buffer circuit, which is same as the circuit 500; a circuit 502 is a Schottky barrier diode decoder circuit (hereinbelow abbreviated to SBD decoder circuit); circuits 503 to 505 are SBD decoder circuits, each of which is same as the circuit 502; circuits 506 to 509 are the level converting circuits indicated in either one of the embodiments described above; a circuit 510 is static the memory cells; circuits 511 to 513 are memory cells identical to the circuit 510; a circuit 522 is a bias current source circuit similar to that constituted by NMOSs 114 to 117 in the embodiment illustrated in FIG. 19; terminals 300, 340 are the address signal input terminals; terminals 301 to 304 are the reference voltage applying terminals; terminals 305 to 308 are power source terminals; terminals 309 to 312 are the input buffer output terminals; terminals 313 to 316 are the SBD decoder output terminals; terminals 317 to 320 are word line terminals; terminals 321, 322 are data line terminals; elements 400 to 409 are NPN transistors; elements 410 to 417 are resistors; an element 418 is a capacitive element; elements 419 to 422 are Schottky barrier diodes (hereinbelow abbreviated to SBD); and elements 423 to 427 are NMOSs.

Figure 30:
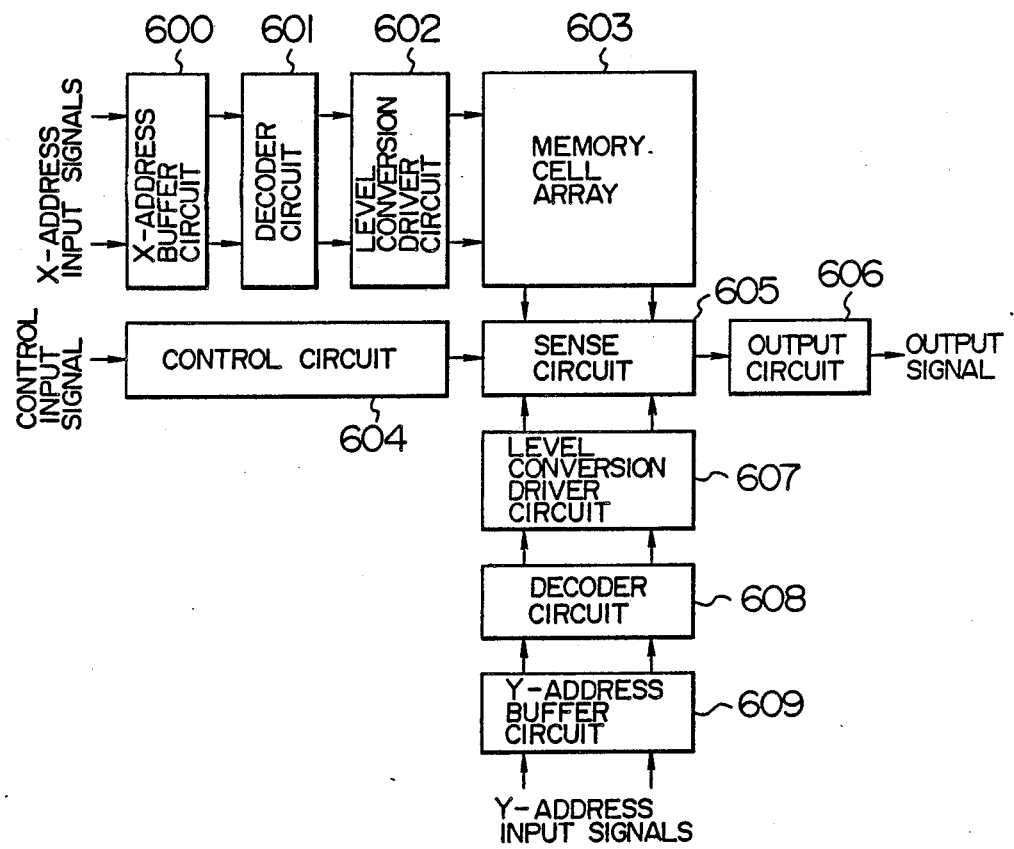
FIG. 30 is a block diagram indicating an example of the semiconductor memory device, to which a memory cell array selection circuit, which is the embodiment indicated in FIG. 28, is applied.

FIG. 30 is a block diagram indicating an example of the semiconductor memory device, to which a memory cell array selection circuit, which is the embodiment indicated in FIG. 28, is applied.

The circuits 500 and 501 in the embodiment illustrated in FIG. 28 correspond to an X-address buffer circuit 600 in FIG. 30, reference numerals 502 to 505 to a decoder circuit 601; 506 to 509 to a level converting driver circuit 602; and 510 to 513 to a memory cell array 603. The other circuit blocks indicated in FIG. 30 are omitted in FIG. 28 and not shown there.

Hereinbelow the operation of this semiconductor memory device will be briefly explained, referring to FIG. 30.

In FIG. 30 the X address buffer circuit 600 detects an X address input signal and outputs a signal, which is necessary for decoding the input signal in the decoder circuit 601 following it.

The decoder circuit 601 decodes the input signal and after the signal level has been converted by the following level converting driver circuit 602, a line or a plurality of lines are selected in the memory cell array 603.

On the other hand, similarly for the Y address input signal, a column or a plurality of columns are selected in the memory cell array 603 by the similar functions of the Y address buffer circuit 609, the decoder circuit 608, and the level converting circuit 607.

By the operation described above one or a plurality of memory cells are selected in the memory cell array 603. Owing to work of the controlling circuit 604 based on a controlling input signal, data are read out from the memory cells or they are written in the memory cells.

When the data are read out, the read out data are sensed by the sensing circuit and outputted as an output signal through the output circuit 606.

Although, in the embodiment illustrated in FIG. 28, an example of the memory cell array selection circuit for the X address input signal is shown, it is a matter of course that it is possible to construct a similar selection circuit for the Y address input signal.

Furthermore, depending on the scale of the semiconductor memory device, a decoder may be added further to the stage following the level converting driver circuit.

Now an embodiment, in which this invention is applied to a semiconductor memory device according to the embodiment illustrated in FIG. 28, will be explained more in detail.

At first the operation of the input buffer circuit and the SBD decoder circuit is explained.

In the input buffer circuit 500 the part consisting of the resistance 417 and the capacitor 418 is a circuit for shifting the level of the input signal. The other elements are operated in the same way as the elements in the input buffer circuit of the embodiment illustrated in FIG. 19 by applying a suitable voltage to the reference voltage applying terminals 301 to 303. That is, depending on whether the input signal is at the high level or at the low level, the constant current produced by the NPN transistor 403 and the resistor 412 or the NPN transistor 406 and the resistor 413 flows through either one of the groups consisting of the NPN transistors 401 and 404 or 402 and 405. For example, if the input terminal 300 is at the low level, the NPN transistors 402 and 405 are conductive and the constant current described above flows through the decoder line 310 connected with the collector of the NPN transistor 405. At this time the constant current stated above is bifurcated to the SBDs in the circuits 504, 505 connected with the decoder line 310 (SBDs similar to the SBD 419, 420 in the circuit 502) and flows through the load resistor (resistor similar to the resistor 414 in the circuit 502) so that the level at the decoder line 310 becomes low. On the other hand no current flows through the decoder line 309 connected with the collector of the NPN transistor 404 and thus it is at the high level.

A similar operation is effected also for the input buffer circuit 501. For example, when the input terminal is at the low level, the decoder lines 311 and 312 are driven at the high and low levels, respectively.

In each of the SBD decoder circuits 502 to 505 there are two sets of two SBDs connected in series. In the case where even one of the two decoder lines connected with these SBDs is at the low level, the constant current stated above flows through the load resistor and thus the output of the SBD decodes is at the low level.

Consequently, in the example described above only the output of the SBD decoder circuit 502 is at the low level and the outputs of the other SBD decoder circuits 503 to 505 are at the high level.

Further the circuit consisting of the elements 401 to 403, 407, 408, 410 to 412 is an active pull-up circuit, which is disposed for the purpose of raising the decoder line to the high level with a tigh speed by means of an emitter follower circuit using the NPN transistor 407 or 408, when the potential of the decoder line is switched over from the low level to the high level.

The reason why two SBDs are connected in series is that the forward voltage across the two SBDs connected in series is greater than the base-emitter voltage of the NPN transistors 407, 408 so that the selected SBD is completely cut off in order to raise sufficiently the high level of the output potential of the SBD decoder circuit.

Further the NPN transistor 409 is disposed for the purpose of shifting the output level of the SBD decoder circuit by the base-emitter voltage.

As explained above, the address signal is decoded by the SBD decoder and one of the decoder output signals 313 to 316 is selected at the high level (terminal 313 in the example described above).

The level converting circuits 506 to 509 convert the level of the decoder signal stated above and drives the word line of the memory cell array directly by the level-converted signal in this embodiment.

Since the memory cells 510 to 513 in this embodiment are high level selection cells, non-inverter type circuits are necessary as level converting circuits 506 to 509 therefore. Consequently, as the level converting circuits, e.g. the circuits used in the embodiments illustrated in FIG. 22, 24 and 25 can be used therefor.

Further the circuits used in the embodiments illustrated in FIGS. 22 and 25 are suitable for reducing the electric power consumption of the level converting circuit driving non-selected word lines.

In addition, when it is necessary to raise the potential of the selected word line to the ground potential, it may be possible to raise the potential of the word line to the ground potential either by adding a PMOS between the output terminal of the level converting circuit and the ground potential or by adding two stages of inverter circuits to the output terminal.

Although, in this embodiment, there is shown an example, in which the word line is driven directly by the level converting circuit, after having decoded the input signal by means of the SBD decoder, it is a matter of course that it may be so constructed that the word line is driven through MOS type internal circuits after the level conversion. In this case or in the case of low level selection memory cells, it is, of course, not necessary that the level converting circuit is of non-inverter type.

As explained above, since the semiconductor integrated circuit device according to this embodiment can convert the level of a single signal with a high speed, it can be so constructed that the input signal is decoded by means of a high speed SBD decoded circuit before the level conversion, while heretofore it was decoded by means of MOS type logic circuits after the level conversion. Thus, according to this invention it is possible to construct a high speed decoder driver circuit.

Although a 2-bit decoder circuit was shown in the embodiment illustrated in FIG. 28, it is a matter of course that a decoder circuit, whose number of bits is greater than two, can be constructed as well. Similarly it may be constructed, of course, by means of a diode decoder or a multiemitter decoder. In addition, although there were shown embodiments, in which the SBD logic multiplier circuit is connected as a decoder circuit, it is possible, of course, to connect another logic multiplier circuit.

Figure 29:
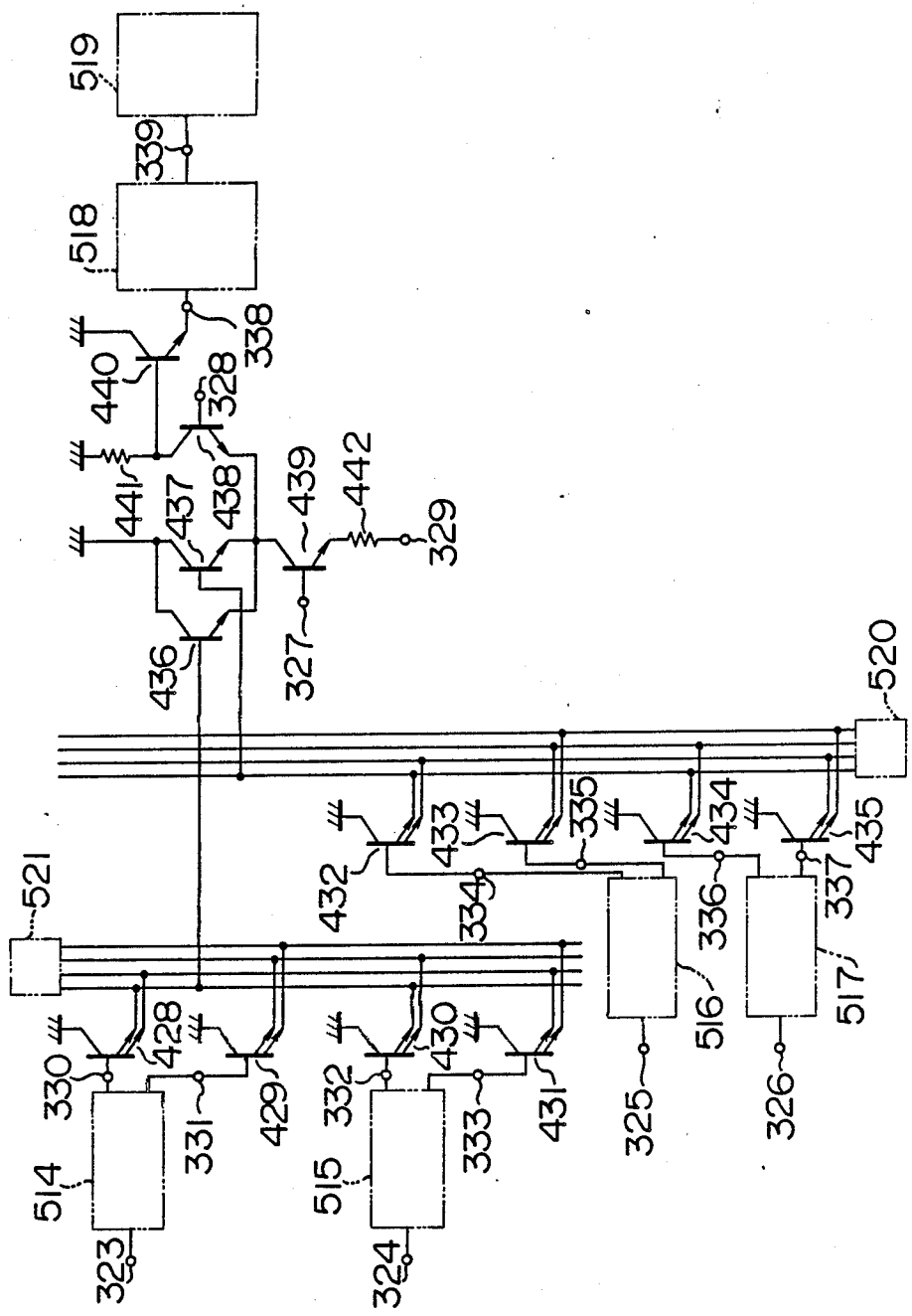
FIG. 29 is a circuit diagram illustrating the construction of the 4-bit decoder and the memory cell array in another embodiment of this invention.

Now FIG. 29 is a circuit diagram illustrating an embodiment of the memory cell array selection circuit in a semiconductor memory device, which is another embodiment of the semiconductor integrated circuit device consisting of an input buffer circuit according to this invention, a bipolar logic circuit, a level converting circuit and MOS type internal circuits. For the sake of simplifying explanation, a 4-bit word group decoder circuit is shown in FIG. 29.

In FIG. 29 circuits 514 to 517 are input buffer circuits, each of which is same as the circuit 200 of the embodiment illustrated in FIG. 19; a circuit 518 is the level converting circuit indicated in the preceding embodiment; a circuit 519 is a static type memory cell, which is the same as the circuit 510 of the embodiment illustrated in FIG. 28; circuits 520, 521 are bias current source circuits, each of which is similar to that constituted by the NMOSs 114 to 117 of the embodiment illustrated in FIG. 19; terminals 323 to 326 are address signal input terminal; terminals 327, 328 are the reference voltage applying terminal; a terminal 329 is the power source terminal; terminals 330 to 337 are input buffer output terminals; a terminal is the decoder output terminal; a terminal 339 is the word line terminal; elements 428 to 435 are multiemitter type NPN transistors; elements 436 to 440 are NPN transistors; and elements 441, 442 are resistors. Further, in FIG. 29, other fifteen decoder circuits, fifteen level converting circuits and memory cell arrays are omitted and not shown for the sake of simplicity.

In the semiconductor integrated circuit device according to this embodiment, after the address signals inputted to the terminals 323, 324, 325 and 326 have been predecoded by means of respective wired OR logic circuits; two series of predecoded signals thus obtained have been decoded by means of a current mode circuit consisting of the elements 436 to 439, 441, 442 and level-converted by the level converting circuit 518, they drive the word line 339 of the memory cell 519 constituted by MOSFETs.

Since the operation of the input buffer circuits 514 to 517 and the wired OR logic decoder circuit is the same as that described for the embodiment illustrated in FIG. 19, explanation thereof is omitted. Further, since the operation of the current mode circuit consisting of the elements 436 to 439, 441, 442 is almost identical to that of the input buffer circuit described for the embodiment illustrated in FIG. 19, explanation thereof is omitted.

The address signal inputted in the input terminals 323, 324 is predecoded by the wired OR logic circuit constituted by the input buffers 514, 515 and multiemitter type NPN transistors 428 to 431 and thus the level of one of four output lines becomes low. In the same way the address signals inputted to the terminals 325, 326 is predecoded and the level of one of four output lines, with which the emitters of the multiemitter type NPN transistors 432 to 435 are connected, becomes low. Now, if the bases of the NPN transistors 436, 437 connected with two series of output lines are at the low level, the constant current in the current mode circuit flows through the NPN transistor 438 and thus the potential at the terminal 338 is at the low level. The NPN transistor 440 is the transistor for the level shift.

One the other hand, in the case where even one of the base input signals is at the high level, the constant current described above doesn't flow through the NPN transistor and thus the potential at the terminal 338 is at the high level. Therefore the outputs of the other fifteen decoder circuits, which are the same as the current mode circuit stated above, are at the high level.

The output signal of the decoder is level-converted by the level converting circuit 518 and drives the word line 339.

Further, if the memory cell 519 is a high level selection cell, it is necessary that the level converting circuit 518 is of inverter type. Consequently e.g. the circuits in the embodiments illustrated in FIGS. 19, 21, 23 and 26 can be used as the level converting circuit 518.

In addition, the circuits used in the embodiments illustrated in FIGS. 19 and 21 are suitable for reducing the electric power consumption in the level converting circuit driving the non-selected word lines.

Further it is possible of course, to form a level converting circuit of non-inverter type by inserting a resistor between the collectors of the NPN transistors 436, 437 and the ground potential and taking out the output from the collector side.

Furthermore it is a matter of course that it is possible to construct the level converting circuit in the same way as that for the embodiment illustrated in FIG. 28.

As explained above, since it is possible to convert the level of a single signal with a high speed by means of the semiconductor integrated circuit device according to this invention, a high speed decoder driver circuit can be so constructed that the input signal is predecoded by the high speed wired OR logic circuit before the level conversion and decoded further by the current mode circuit, while heretofore the input signal was decoded in an MOS type logic circuit after the level conversion.

According to this invention, since the semiconductor integrated circuit device consisting of internal circuits receiving input signals for bipolar type circuits and internal circuits treating signals for MOS type circuits includes a high speed logic circuit treating the signals for bipolar type circuits and is so constructed that the level conversion to the signal level for the MOS type circuits is effected in the stage of a bipolar type logic circuit, an excellent effect can be obtained that the speed of the semiconductor integrated circuit described above can be increased.

Figure 31:
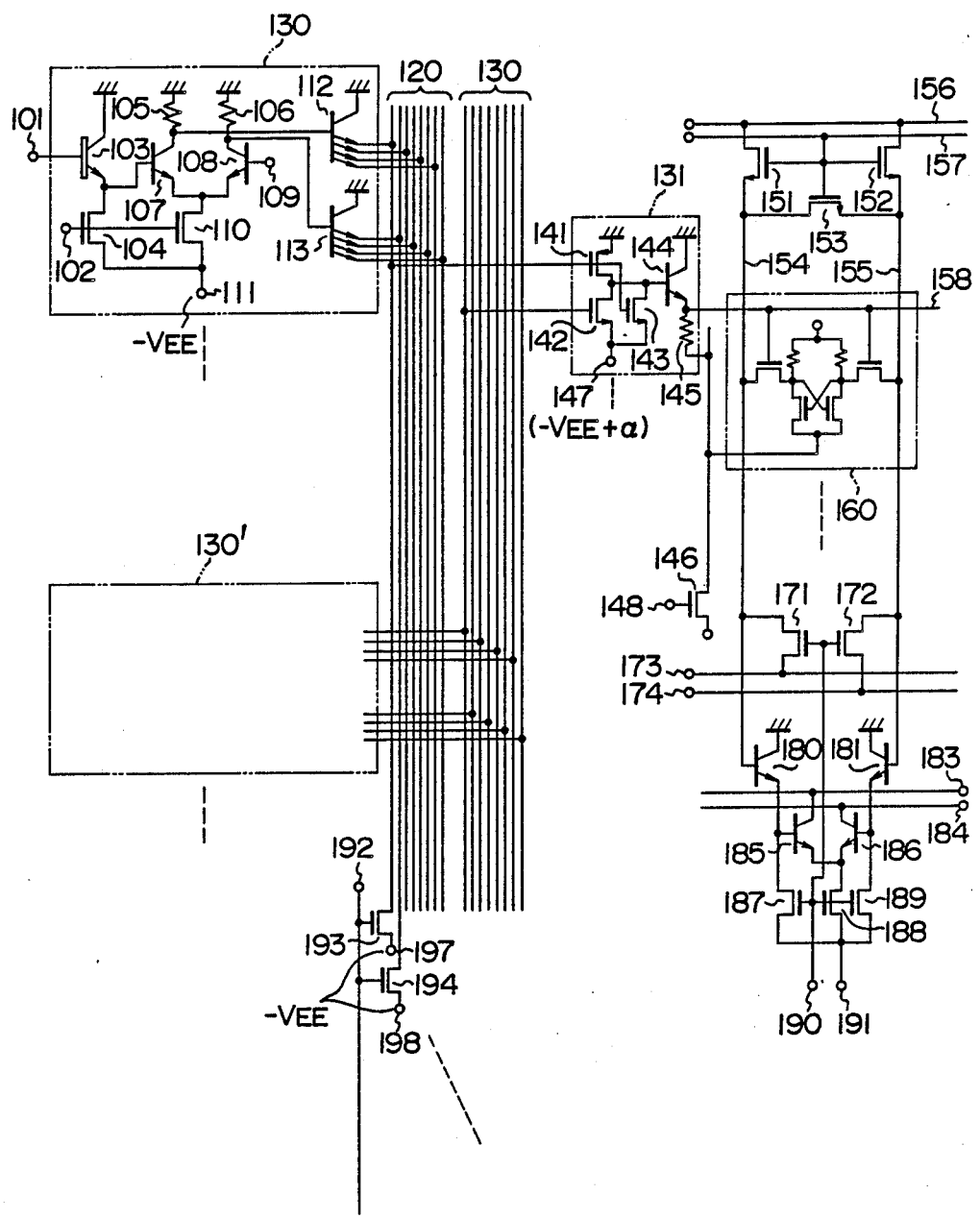
FIG. 31 is a circuit diagram of the semiconductor memory device according to another embodiment of this invention.

FIG. 31 is a circuit diagram illustrating the basic construction of the semiconductor memory device according to still another embodiment of this invention and shows the circuit from the input of the address signal to the detection of the memory cell signal.

Now the operation of this circuit will be explained, referring to FIG. 31. The address signal of ECL (Emitter Coupled Logic) inputted to the input terminal 101 is led to the base of a transistor 107 in a current mode circuit, after having been level-shifted by about 0.8 V by an emitter follower transistor 103; amplified as the voltage drop across a resistors 105 or 106; and outputted to a multiemitter transistor 112 or 113. Here MOS FETs 104 and 110 are disposed for supplying a constant current. A terminal 111 is connected with a negative power source—$V_{EE}$ of about −5 V and a terminal 102 is connected with a constant voltage source, whose voltage is higher by a predetermined voltage than the negative power source. Each of the multiemitters is connected with one of the groups of signal lines 120. In this embodiment a plurality of circuits, each of which is the same as the circuit from the input terminal to the outputs of the multiemitter transistors enclosed by a broken line, are disposed and the input signal is predecoded by a logic circuit connected with the group of signal lines 120 and called wired-OR logic. A similar circuit 130' is connected with a group of signal lines 130 and a predecoded signal is outputted. Here MOS FETs 193, 194 are devices for supplying constant currents to the multiemitter transistors 112, 113 through the groups of signal lines 120, 130 and each of them is disposed for every line of the groups of signal lines 120, 130. Here terminals 193, 194 are connected with the same negative power source —$V_{EE}$ as the terminal 111 and a terminal 192 is connected with the same constant voltage power source as the terminal 102. One signal line is selected for every group of signal lines 120, 130, to which predecoded address signals are outputted and led to the gates of the MOS FETs 141, 142, 143 of a modified two-input NOR logic circuit. They are further decoded by this modified two-input NOR logic circuit and drive the word line 158, after having obtained a load driving power by means of a bipolar NPN transistor 144.

Contrarily to the fact that a usual N-input CMOS NOR circuit consisted of N P-channel type MOS FETs connected in series and N N-channel type MOS FETs connected in parallel, in the modified NOR circuit according to this embodiment the number of P-channel type MOS FETs connected for the NOR logic is so set that it is smaller than the number of N-channel type MOS FETs connected in parallel. Since the P-channel type MOS FET utilizes the mobility of carriers due to holes in the channel, the on-resistance is greater in a device having the same size with respect to the N-channel type MOS FET. Consequently, in order to obtain a CMOS NOR circuit having a high integration density and a high speed, it is significant that the number of the P-channel type MOS FETs connected in series is small. Although the gates of the P-channel type MOS FETs 141 are connected here with the group of signal lines 120, it is a matter of course that the loads of the multiemitter transistors 112 and 113 are equalized, which has an effect to increase the speed, if a half of the inputs of the two input NOR circuits are taken out from the group 120 and the other half from the group 130. Further a terminal 147 is not connected with the negative power source —$V_{EE}$ of about −5 V, but with a constant voltage source —$V_{EE+}$, whose voltage is lower than the low level of the outputs of the multiemitter transistors 112, 113 by the threshold voltage of the N-channel type NOS FETs.

When the word line 158 is selected by the circuit described above, which has received the address signal, and raised to the high level, current flows through an MOS FET for information transmission connected with the low level terminal of the flipflop circuit in the memory cell 160, which gives rise to a potential difference between data lines 154 and 155 by N-channel depletion type MOS FETs 151, 152 and an equalizing N-channel depletion type MOS FET 153 in the load. Here a terminal 156 is connected with a power source, whose voltage is lower than the ground potential by 0.5-1 V, and further a terminal 157 is connected with the ground potential, when information is read out, and with a driving circuit supplying the negative source voltage $-V_{EE}$, when information is written-in. In addition, the fact that the MOS FETs are of depletion type holds the potential at the data lines 154 and 155 at the high level, which is desirable for the stabilization of the memory operation such as increase in the strength against $\alpha$-particles, etc. The voltage at the data lines 154 and 155 is level-shifted by emitter follower type transistors 180, 181; led to the bases of the transistors 185, 186 constituting a differential amplifier; and outputted to common signal lines 183, 184 as a current difference. Here MOS FETs 187, 188, 189 are MOS FETs for supplying a constant current. A terminal 190 is a terminal for selecting the signal of the differential amplifier and outputting it to the common signal line and the decoded signal on the terminal is similar to that supplied to the word line 158. Further a terminal 191 is a negative power source terminal $-V_{EE}$. Terminals 173, 174 are terminals for supplying signals, which are written-in, and thus it is possible to write information in the memory cell 160 by raising the potential at either one of MOS FETs 171 and 172 to a potential close to that of the negative potential supplying source for the flipflop circuit in the memory cell therethrough.

Consequently, according to this embodiment, since the number of the P-channel type MOS FETs connected in series in the CMOS NOR circuit of the decoder circuit is smaller than the number of the N-channel type MOS FET connected in parallel, it is possible to realize the increase of the speed of the decoder circuit.

What is claimed is:
1. A combination circuit comprising:
(a) a first bipolar transistor, the base of which responds to an input signal;
(b) a second bipolar transistor, the emitter of which is coupled with the emitter of said first bipolar transistor;
(c) a current source connected commonly to the emitters of said first and said second bipolar transistors;
(d) a third bipolar transistor, the base of which responds to a signal of the collector of said first bipolar transistor;
(e) a fourth bipolar transistor, the base of which responds to a signal of the collector of said second bipolar transistor;
(f) a first MOS transistor, the drain-source current path of which is coupled between the emitter of said third bipolar transistor and a first operating potential;
(g) a second MOS transistor, the drain-source current path of which is coupled between the emitter of said fourth bipolar transistor and said first operating potential;
(h) a first circuit, the input of which responds to a signal from said third bipolar transistor; and
(i) a second circuit, the input of which responds to a signal from said fourth bipolar transistor,
wherein said first and said second MOS transistors are connected with each other in a cross-coupled configuration, and
wherein input stages of said first and second circuits include MOS transistors, and output stages of said first and second circuits include bipolar transistors.

2. A combination circuit according to claim 1, wherein the collector of said first bipolar transistor is connected to a second operating potential through a first load, wherein the collector of said second bipolar transistor is connected to said second operating potential through a second load, and wherein the collectors of said third and said fourth bipolar transistors are connected to said second operating potential.

3. A combination circuit according to claim 2, wherein said first, said second, said third and fourth bipolar transistors are NPN transistors.

4. A combination circuit according to claim 3, wherein the drain of said first MOS transistor is connected to the gate of said second MOS transistor, and the drain of said second MOS transistor is connected to the gate of said first MOS transistor.

* * * * *

REEXAMINATION CERTIFICATE (1774th)
United States Patent [19]
Higuchi et al.

[11] B1 4,937,480

[45] Certificate Issued Aug. 18, 1992

[54] BICMOS BUFFER CIRCUIT

[75] Inventors: Hisayuki Higuchi, Kokubunji; Makoto Suzuki, Niiza; Noriyuki Homma, Kodaira, all of Japan

[73] Assignee: Hitachi, Ltd.

Reexamination Request:
No. 90/002,566, Feb. 19, 1992

Reexamination Certificate for:
Patent No.: 4,937,480
Issued: Jun. 26, 1990
Appl. No.: 373,263
Filed: Jun. 27, 1989

Related U.S. Application Data

[63] Continuation of Ser. No. 131,644, Dec. 11, 1987, Pat. No. 4,858,191.

[30] Foreign Application Priority Data

Dec. 12, 1986 [JP] Japan .............................. 61-297030
Apr. 30, 1987 [JP] Japan .............................. 62-104688
Sep. 11, 1987 [JP] Japan .............................. 62-226338

[51] Int. Cl.$^5$ ............... H03K 19/01; H03K 19/003; H03K 19/082; H03K 19/094
[52] U.S. Cl. ............................ 307/570; 307/446; 307/443; 307/279
[58] Field of Search ............... 307/570, 443, 455, 530

[56] References Cited
U.S. PATENT DOCUMENTS

4,740,718  4/1988  Matsui .................. 307/446
4,754,171  6/1988  Dasai et al. ........... 307/455

*Primary Examiner*—J. Zazworsky

[57] ABSTRACT

A semiconductor integrated circuit includes an input buffer circuit, a decoder circuit and a plurality of memory cells. Each of the input buffer circuit and the decoder circuit consists of a combination of bipolar transistors and MOS transistors. In this combination various measures are taken to increase the operation speed and to reduce the electric power consumption. In an example thereof the data line load for the memory cells is constituted by Schottky barrier type diodes. In another example the load used for the respective emitter follower transistors is constituted by an MOS transistor operating as a variable resistance. In still another example, in a CMOS NOR circuit of the decoder circuit the number of P channel MOS transistors are fewer than the number of N channel MOS transistors.

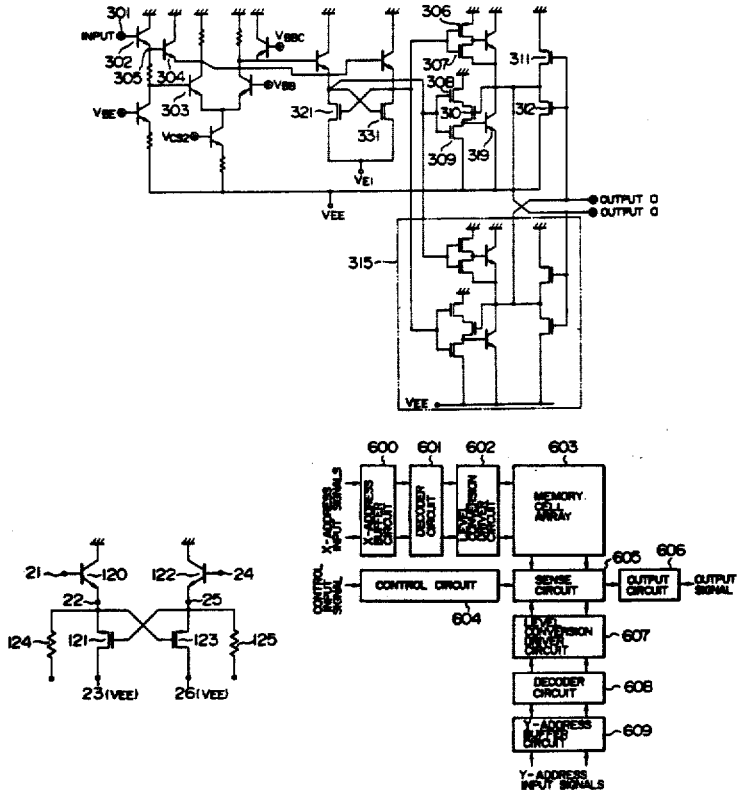

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-4 is confirmed.

* * * * *